(12) United States Patent
Gardner et al.

(10) Patent No.: US 11,908,747 B2
(45) Date of Patent: Feb. 20, 2024

(54) METHOD FOR DESIGNING THREE DIMENSIONAL METAL LINES FOR ENHANCED DEVICE PERFORMANCE

(71) Applicant: Tokyo Electron Limited, Tokyo (JP)

(72) Inventors: Mark I. Gardner, Cedar Creek, TX (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 367 days.

(21) Appl. No.: 17/364,077

(22) Filed: Jun. 30, 2021

(65) Prior Publication Data

US 2022/0139783 A1    May 5, 2022

Related U.S. Application Data

(60) Provisional application No. 63/107,768, filed on Oct. 30, 2020.

(51) Int. Cl.
| | |
|---|---|
| *H01L 21/8238* | (2006.01) |
| *H01L 27/092* | (2006.01) |
| *H01L 23/535* | (2006.01) |
| *H01L 29/06* | (2006.01) |
| *H01L 29/423* | (2006.01) |
| *H01L 29/786* | (2006.01) |

(Continued)

(52) U.S. Cl.
CPC .. *H01L 21/823807* (2013.01); *H01L 21/0259* (2013.01); *H01L 21/02532* (2013.01);
(Continued)

(58) Field of Classification Search
CPC ....... H01L 21/823807; H01L 21/02532; H01L 21/0259; H01L 21/30604; H01L 21/308;
(Continued)

(56) References Cited

U.S. PATENT DOCUMENTS

| | | | |
|---|---|---|---|
| 5,286,674 A | 2/1994 | Roth et al. | |
| 5,308,778 A * | 5/1994 | Fitch | H01L 27/0688 |
| | | | 257/E29.267 |

(Continued)

FOREIGN PATENT DOCUMENTS

CN    104823282 B    2/2018

OTHER PUBLICATIONS

International Search Report and Written Opinion dated Nov. 26, 2021 in PCT/US2021/044876, 8 pages.

*Primary Examiner* — Kimberly N Rizkallah
*Assistant Examiner* — Pratiksha Jayant Lohakare

(57) ABSTRACT

A method of processing a substrate includes forming a first layer stack on a substrate, the first layer stack including conductive layers and dielectric layers that alternate in the first layer stack. An opening is formed in the first layer stack, the opening extending through each of the conductive layers in the first layer stack such that sidewalls of each of the conductive layers are exposed within the opening. A second stack of layers is formed within the opening, the second stack of layers including channel layers of semiconductor material positioned in the second stack such that each channel layer contacts exposed sidewalls of a respective conductive layer of the first layer stack. Transistor channels are from the channel layers of the second stack such that each transistor channel extends between exposed sidewalls of a respective conductive layer within the opening.

18 Claims, 22 Drawing Sheets

(51) Int. Cl.
  *H01L 29/66* (2006.01)
  *H01L 21/02* (2006.01)
  *H01L 21/306* (2006.01)
  *H01L 21/308* (2006.01)
  *H01L 21/768* (2006.01)

(52) U.S. Cl.
  CPC ...... *H01L 21/308* (2013.01); *H01L 21/30604* (2013.01); *H01L 21/76895* (2013.01); *H01L 21/823871* (2013.01); *H01L 23/535* (2013.01); *H01L 27/092* (2013.01); *H01L 29/0665* (2013.01); *H01L 29/42392* (2013.01); *H01L 29/66742* (2013.01); *H01L 29/78696* (2013.01)

(58) Field of Classification Search
  CPC ....... H01L 21/76895; H01L 21/823871; H01L 23/535; H01L 27/092; H01L 29/0665; H01L 29/42392; H01L 29/66742; H01L 29/78696; H01L 29/41766; H01L 21/823412; H01L 29/0673; H01L 29/0692; H01L 29/413; H01L 29/41725; H01L 29/66439; H01L 21/8221; H01L 29/775; B82Y 10/00
  USPC ........................................................ 438/154
  See application file for complete search history.

(56) References Cited

U.S. PATENT DOCUMENTS

| | | | |
|---|---|---|---|
| 5,308,782 A | 5/1994 | Mazuré et al. | |
| 5,393,681 A | 2/1995 | Witek et al. | |
| 5,398,200 A | 3/1995 | Mazuré et al. | |
| 5,612,563 A | 3/1997 | Fitch et al. | |
| 5,627,395 A | 5/1997 | Witek et al. | |
| 8,163,617 B2 | 4/2012 | Ahn | |
| 8,187,938 B2 | 5/2012 | Lim et al. | |
| 8,890,119 B2 | 11/2014 | Doyle et al. | |
| 9,287,283 B2 | 3/2016 | Lim et al. | |
| 9,293,560 B2 | 3/2016 | Doyle et al. | |
| 9,818,864 B2 | 11/2017 | Doyle et al. | |
| 11,538,690 B2* | 12/2022 | Luan | H01L 21/32137 |
| 11,791,167 B2* | 10/2023 | Schepis | H01L 21/32105 |
| | | | 438/197 |
| 2003/0124854 A1* | 7/2003 | Parker | H10B 61/00 |
| | | | 257/E27.005 |
| 2007/0108498 A1* | 5/2007 | Lee | H10B 41/30 |
| | | | 257/E29.302 |
| 2010/0258852 A1 | 10/2010 | Lim et al. | |
| 2011/0024818 A1 | 2/2011 | Ahn | |
| 2011/0287612 A1* | 11/2011 | Lee | H10B 43/10 |
| | | | 257/E21.09 |
| 2012/0181603 A1 | 7/2012 | Ahn | |
| 2012/0211822 A1 | 8/2012 | Lim et al. | |
| 2014/0166981 A1 | 6/2014 | Doyle et al. | |
| 2015/0072490 A1 | 3/2015 | Doyle et al. | |
| 2016/0163731 A1* | 6/2016 | Tan | H01L 29/22 |
| | | | 257/324 |
| 2016/0163856 A1 | 6/2016 | Doyle et al. | |
| 2019/0326288 A1* | 10/2019 | Hashemi | H01L 21/823821 |
| 2020/0105929 A1* | 4/2020 | Zhang | H01L 29/1033 |
| 2020/0176326 A1* | 6/2020 | Liao | H01L 21/02603 |
| 2020/0185405 A1* | 6/2020 | Cui | H01L 29/1037 |
| 2021/0111183 A1* | 4/2021 | Gardner | H01L 27/0924 |

* cited by examiner

2200

Forming a first layer stack on a substrate, the first layer stack including metal layers and dielectric layers that alternate in the first layer stack 2202

Forming openings in the first layer stack, such that a semiconductor layer positioned under the first layer stack is uncovered 2204

Forming, by epitaxial growth, a second stack of layers within the openings from the semiconductor layer, the second stack of layers including alternating layers of semiconductor material aligned with respective layers of the first layer stack 2206

Forming transistor channels from semiconductor layers of the second stack of layers in a same plane as metal layers from the first stack, such that the transistor channels extend between given metal layers within the openings 2208

FIG. 22

METHOD FOR DESIGNING THREE DIMENSIONAL METAL LINES FOR ENHANCED DEVICE PERFORMANCE

CROSS REFERENCE TO RELATED APPLICATIONS

The present application claims the benefit of U.S. Prov. Ser. No. 63/107,768, entitled "Advanced Design of 3D Metal Lines for Enhanced 3D Device Performance", filed on Oct. 30, 2020. The entire content of the above application is incorporated by reference herein.

BACKGROUND

Field of the Invention

This disclosure relates to microelectronic devices including semiconductor devices, transistors, and integrated circuits, including methods of microfabrication.

Description of the Related Art

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Semiconductor technologies are continually progressing to smaller feature sizes of 14 nanometers and below. The continual reduction in sizes of features, from which the foregoing elements are fabricated, places ever-greater demands on techniques used to form the features. During the manufacturing of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

Accordingly, it is one object of the present disclosure to provide methods and systems for designing three dimensional metal lines for enhanced device performance.

SUMMARY OF THE INVENTION

Aspects of the present disclosure methods and structures for designing three dimensional metal lines for enhanced device performance by combining 3D metal layers within different layers of a 3D dielectric stack to generate an enhanced 3D stack of horizontal nano sheets.

Aspect (1) includes a method of processing a substrate, the method including: forming a first layer stack on a substrate, the first layer stack including conductive layers and dielectric layers that alternate in the first layer stack; forming an opening in the first layer stack, the opening extending through each of the conductive layers in the first layer stack such that sidewalls of each of the conductive layers are exposed within the opening; forming a second stack of layers within the opening, the second stack of layers including channel layers of semiconductor material positioned in the second stack such that each channel layer contacts exposed sidewalls of a respective conductive layer of the first layer stack; and forming transistor channels from the channel layers of the second stack such that each transistor channel extends between exposed sidewalls of a respective conductive layer within the opening.

Aspect (2) includes the method of claim 1, wherein the forming a first layer stack includes depositing metal layers as the conductive layers.

Aspect (3) includes the method of claim 2, wherein the depositing metal includes depositing a different metal material for each of the metal layers.

Aspect (4) includes the method of claim 2, wherein the depositing metal includes depositing a same different metal material for each of the metal layers.

Aspect (5) includes the method of claim 1, wherein: the forming an opening includes exposing a semiconductor surface of the substrate, and the forming a second stack includes epitaxially growing sacrificial layers of semiconductor material that alternate with the channel layers of semiconductor material in the second stack.

Aspect (6) includes the method of claim 5, wherein the forming a second stack includes epitaxially growing sacrificial layers of SiGe material which provide etch selectivity with respect to the channel layers.

Aspect (7) includes the method of claim 1, wherein the forming a second stack of layers includes forming each of the channel layers in the same plane as a respective conductive layer such that ends of the channel layers are aligned with sidewalls of the respective conductive layer.

Aspect (8) includes the method of claim 1, wherein the forming a second stack of layers includes forming a plurality of second stacks of layers within the opening by etching an opening in the second stack that divides the second stack into a plurality of second stacks.

Aspect (9) includes the method of claim 1, wherein: the forming an opening includes forming a plurality of openings in the first layer stack, the forming a second stack of layers includes forming a plurality of second stacks within the openings respectively, and forming transistor channels from the channel layers of each second stack.

Aspect (10) includes the method of claim 1, wherein the forming transistor channels includes forming a gate-all-around (GAA) structure around each channel layer.

Aspect (11) includes the method of claim 10, wherein the gate-all-around GAA structure includes: selectively depositing a high-k dielectric layer around the channel layer; and selectively depositing a gate metal on the high-k dielectric layer.

Aspect (12) includes a method of processing a substrate, the method including: forming a first stack of layers on a substrate, the first stack of layers including metal layers and dielectric layers that alternate in the first stack of layers; forming openings in the first stack of layers and depositing a first semiconductor layer in the openings uncovered in the first stack of layers such that the first semiconductor layer rests over the substrate; forming a second stack of layers within the openings over the first semiconductor layer by epitaxial growth, the second stack of layers including second semiconductor layers and epitaxial layers that alternate in the second stack of layers and are aligned with respective layers of the first stack of layers; and forming transistor channels from the epitaxial layers of the second stack of layers in a same plane as the metal layers from the first stack of layers such that the transistor channels extend between the metal layers and the epitaxial layers within the openings.

Aspect (13) includes the method of claim 12, further including: forming the openings in the first stack of layers by: depositing a mask layer over at least a portion of a capping layer that is deposited on top of the first stack of layers; and executing a first etching, the first etching etches portions of the first stack of layers not covered by the first mask layer to form the openings in the first stack of layers, wherein the openings in the first stack of layers are of a length equal to the a predetermined distance.

Aspect (14) includes the method of claim 13, wherein the first mask layer includes a photoresist (PR) mask layer.

Aspect (15) includes the method of claim 12, wherein the openings in the first stack of layers include a first opening and a second opening, and wherein the first opening and the second opening has a base that is formed by the substrate layer.

Aspect (16) includes the method of claim 15, further including: forming a second stack of layers within each of the first opening and the second opening; and depositing another capping layer over each of the second stack of layers formed within the first opening and the second opening.

Aspect (17) includes the method of claim 16, further including: depositing a second mask layer over the another capping layer of the second stack of layers, such that the second mask layer extends over the another capping layer to overlap a portion of the capping layer, wherein the width of the second mask layer equals to a second predetermined distance.

Aspect (18) includes the method of claim 17, further including: executing a second etching on the second stack of layers, the second etching etches a first set of portions of the second stack of layers not covered by the second mask layer to form openings in the second stack of layers.

Aspect (19) includes the method of claim 18, wherein a second set of portions of the second stack of layers covered beneath the second mask layer form a third stack of layers based on the second etching, wherein the third stack of layers are of a width equal to the second predetermined distance.

Aspect (20) includes the method of claim 19, wherein the second set of portions of the second stack of layers covered beneath the second mask layer that form the third stack of layers includes a portion of the second semiconductor layers and a portion of the epitaxial layers.

The order of discussion of the different steps as described herein has been presented for the sake of clarity. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 22 illustrates a data flow diagram for an exemplary method of processing a substrate, according certain embodiments.

Figure 1:
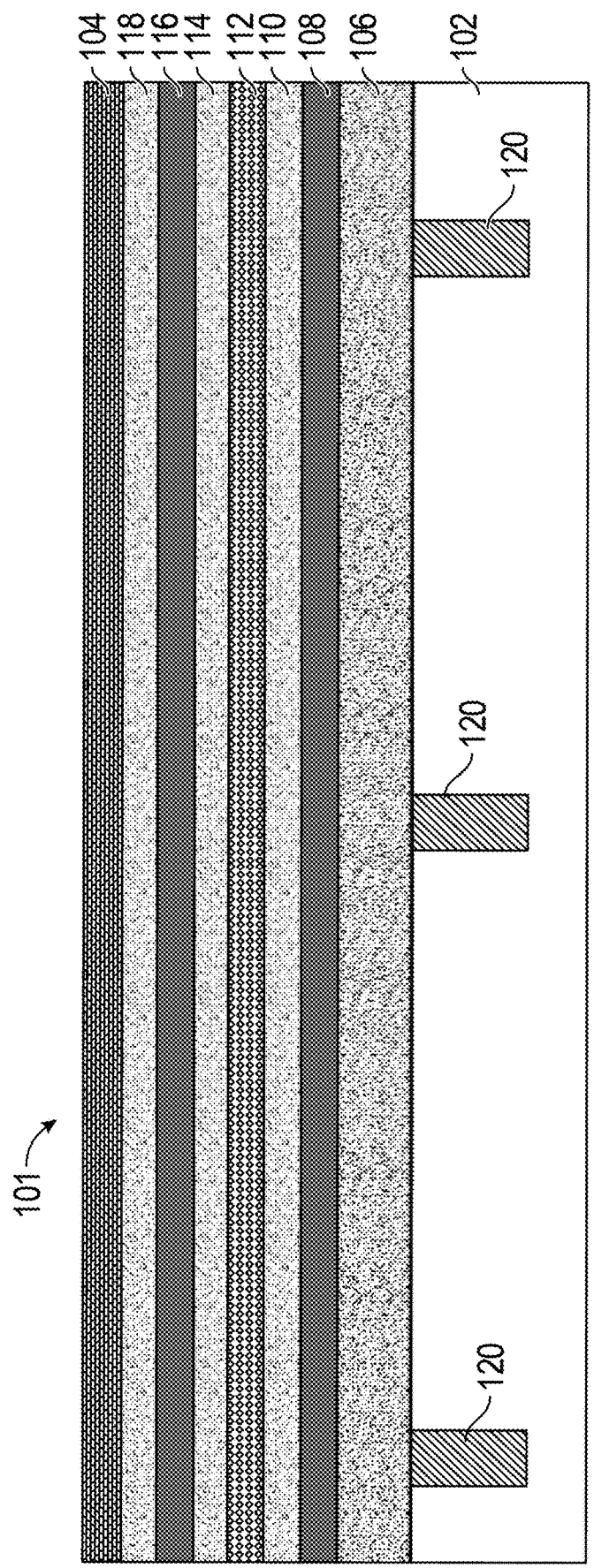
FIG. 1 illustrates a first stack of layers with alternating layers of dielectric material and metal material, according to certain embodiments.

DETAILED DESCRIPTION OF THE PREFERRED EMBODIMENTS 3D integration, i.e. the vertical stacking of multiple devices, aims to overcome scaling limitations experienced in planar devices by increasing transistor density in volume rather than area. Although device stacking has been successfully demonstrated and implemented by the flash memory industry with the adoption of 3D NANO, application to random logic designs is substantially more difficult. 3D integration for logic chips (CPU (central processing unit), GPU (graphics processing unit), FPGA (field programmable gate array, SoC (System on a chip)) is being pursued.

Techniques herein enable higher density circuits to be produced at a reduced cost. Embodiments include 3D Horizontal Nano sheets with gate-all-around (GAA) architecture logic designs. N+S/D and P+S/D metal stacks can be customized with the techniques herein.

Techniques herein include methods for forming GAA transistor structures. Techniques include forming a first stack of layers that includes metal layers alternating with dielectric layers. Openings are formed within the first stack of layers to grow a second layer stack by epitaxial growth. The second layer stack includes alternating layers of semiconductor material that can be etched selective to other semiconductor materials. Transistor channels are formed from a portion of the semiconductor layers that are in plane with metal layers. The transistor channel structures extending from metal line to metal line in a given plane. The metal lines already connected to the transistor structures can function as local interconnects, facilitating connections to a vertical stack of lateral GAA transistors.

Of course, the order of discussion of the different steps as described herein has been presented for clarity's sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

In the drawings, like reference numerals designate identical or corresponding parts throughout the several views. Further, as used herein, the words "a," "an" and the like generally carry a meaning of "one or more," unless stated otherwise. The drawings are generally drawn to scale unless specified otherwise or illustrating schematic structures or flowcharts.

Furthermore, the terms "approximately," "approximate," "about," and similar terms generally refer to ranges that include the identified value within a margin of 20%, 10%, or preferably 5%, and any values there between.

Techniques herein provide advanced processes to form metal lines in three dimensional (3D) devices. Embodiments include combining a 3D stack of alternating metal and dielectric layers with a 3D stack of horizontal nanosheet devices for enhancement of transistor performance. N+S/D (Source/Drain) and P+S/D metal stacks can be customized with the methods herein. Embodiments enable improved device performance Idsat (Drain current saturation), which is achieved because very high electron and hole concentrations are enabled with self-aligned S/D regions. Wiring layout alignment herein may be executed prior to the nanosheet formation for a more efficient circuit layout as an option. Techniques enable horizontal nanosheets/wires with GAA architecture logic designs. Other embodiments include complementary field-effect transistors (CFET), side-by-side vertical stacks of transistors, and many 3D device structures.

Techniques herein will now be described with reference to the accompanying drawings. An example process flow is described in FIGS. 1-21. The example process provides stacks of 3D GAA horizontal nano-sheet devices side-by-side using a 3D layer stack of metal and dielectric layers for high-performance CMOS devices.

In FIG. 1, a layer stack is deposited on a substrate. A cross-sectional substrate segment is illustrated. The layer stack includes alternating layer of dielectric material and metal (conductive material). The example embodiment of FIGS. 1-21 will include three transistors with GAA horizontal nanosheets. While three transistors layers are shown in this invention example, many more layers (N layers) can be used for 3D device formation herein.

As seen in FIG. 1, a first stack of layers 101 is deposited on a substrate 102 with a first capping layer 104 deposited on top of the first stack of layers 101. FIG. 1 illustrates a cross-sectional segment of the substrate 102. The first stack of layers 101 includes dielectric layers 106, 110, 114, and 118 that alternate with conductive layers 108, 112, and 116.

The dielectric material of the layers 106, 110, 114, and 118 may include a low K dielectric material such as Nanopourous Silica, Hydrogensilsesquioxanes (HSQ), Teflon-AF (Polytetrafluoethylene or PTFE), and/or Silicon Oxyflouride (FSG), although any other suitable type of dielectric material may be used. Further, the dielectric layers 106, 110, 114 and 118 may be made of the same dielectric material or different dielectric materials.

The conductive layers 108, 112, and 116 may be any conductive material such as metal and may include lithium, titanium, titanium nitride layer (TiN), tungsten, and/or metal nitrite, although any other type of conductive material may also be included. Further, the layers 108, 112, and 116 may be made of the same conductive material or different conductive materials.

The type of material utilized to form the conductive layers 108, 112, and 116 may be tailored to the type of transistor that the conductive layer will connect to. By way of an example, an NMOS transistor type may use a first type of metal referred to as "metal 1," while a PMOS transistor type may use a second type of metal referred to as "metal 2." In the example embodiment of FIGS. 1-21, the layer 108 is made of metal 1 which connects to an NMOS device, and the layers 112 and 116 are made of metal 2 which connects to PMOS devices. The type of metal generally depends on circuit requirements which will determine the Vt (i.e. threshold voltage) of the NMOS or PMOS devices. Also the thickness of high-k gate dielectric and type of High K material will also factor into this metal selection as well as the thickness of the high K gate dielectric material. Also stacks of metals may be utilized to further fine tune this Vt. Some metals as examples are group comprising ruthenium, Ru, tantalum nitride, TaN, titanium nitride, TiN, and tungsten, TiC, Ga, Gd, TiON, W, TaSiN, TiSiN, Mo, WN, Al, Cu and combinations thereof. In alternative embodiments, the conductive layers 108, 112, and 116 may all be made of the same material, or may all be made of different materials from one another.

The substrate 102 further includes buried power rails 120 placed in the substrate 102 below the active devices. In another embodiment, the power rails may not be buried in the substrate 102 and instead, the power rails may be external to the substrate 102 such as above the active devices.

Figure 2:
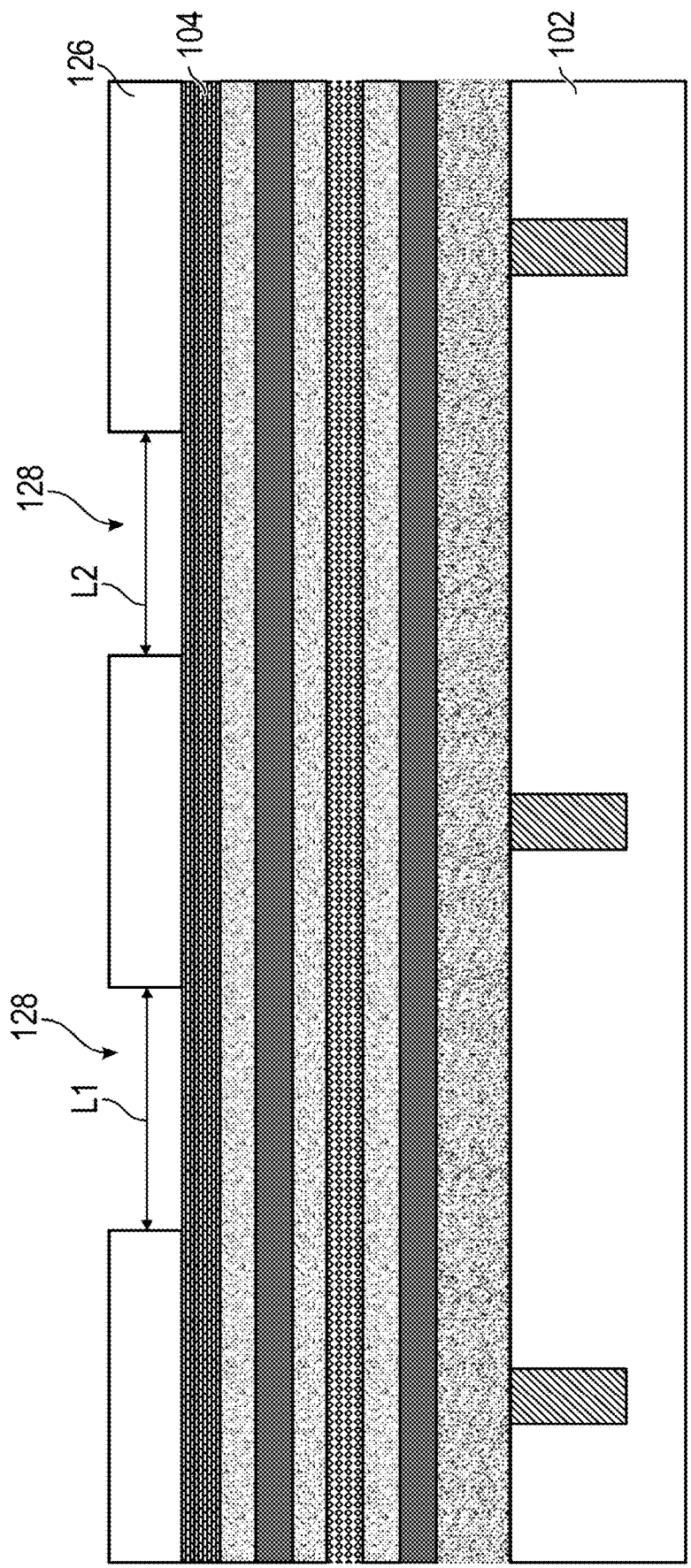
FIG. 2 illustrates applying a plurality of first mask layers over a first capping layer deposited on the first stack of layers of FIG. 1, according to certain embodiments.
Figure 3:
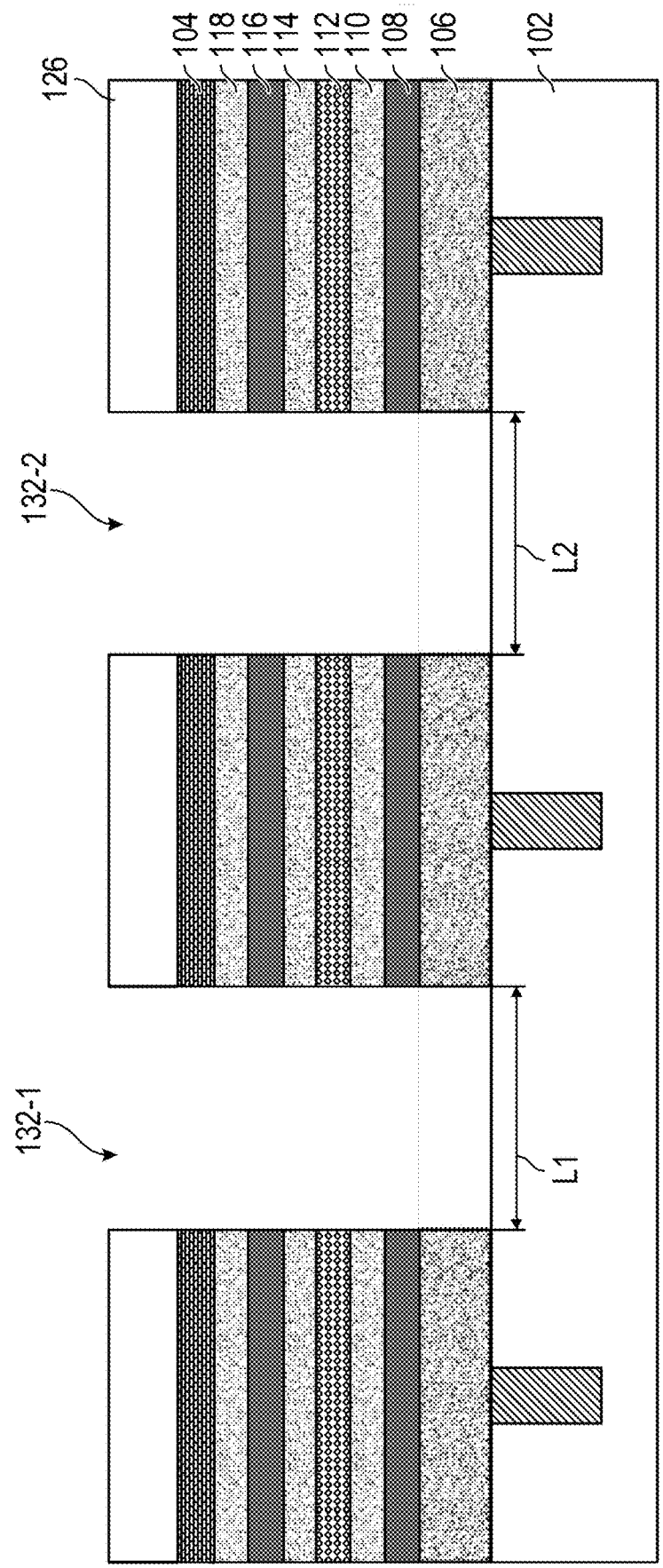
FIG. 3 illustrates etching of the first stack of layers of FIG. 2, according to certain embodiments.

FIGS. 2 and 3 illustrate the forming of openings in the first stack of alternating dielectric and conductive layers 101. As seen in FIG. 2, a mask layer 126 is deposited over the first capping layer 104. The mask layer 126 can be a photoresist (PR). The mask layer 126 is patterned such that there are open spaces 128 of a first predetermined length L1 and L2 in the mask layer 126. While FIG. 2 shows L1 and L2 as equal length, the length L1 and L2 may not be equal to each other. Although, mask layer 126 illustrated has two open spaces 128, any number of open spaces may be formed in the mask layer 126.

Referring now to FIG. 3, the first stack of layers 101 is etched using the mask layer 126 to open future 3D nanosheet regions. That is, with an etch mask layer 126 in place, the first stack of layers 101 can be directionally etched through all of the layers in the layer stack or at least etching through metal layers. The openings formed herein can define the L dimension of the device for this example three-transistor stack. In the embodiment of FIG. 3, first opening 132-1 and second opening 132-2 are etched through all of the layers 106, 108, 110, 112, 114, 116, 118, and 104 to expose the underlying substrate 102 in regions not covered by the mask layer 126. Exposure of the underlying substrate permits epitaxial growth of semiconductor layers within the openings 132-1 and 132-2 as will be discussed below. The first opening 132-1 and the second opening 132-2 are of lengths equal to L1 and L2 corresponding to the mask opening dimensions, respectively. Note that L1 and L2 can have different dimensions or can be of the same dimensions as defined by the mask layer 126.

Figure 4:
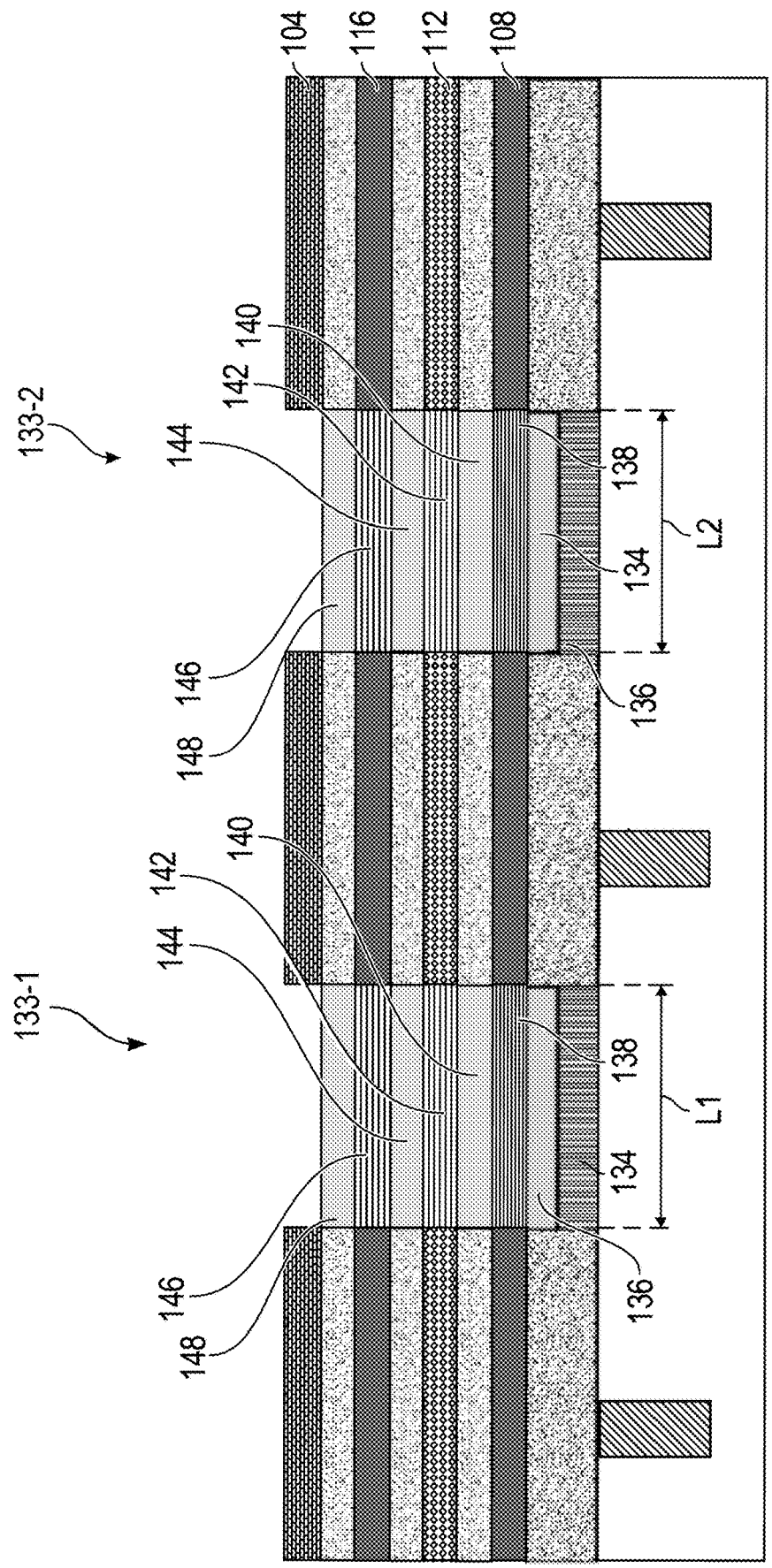
FIG. 4 illustrates depositing a second stack of layers with alternating semiconductor layers and epitaxial layers in etched regions of FIG. 3, according to certain embodiments.
Figure 5:
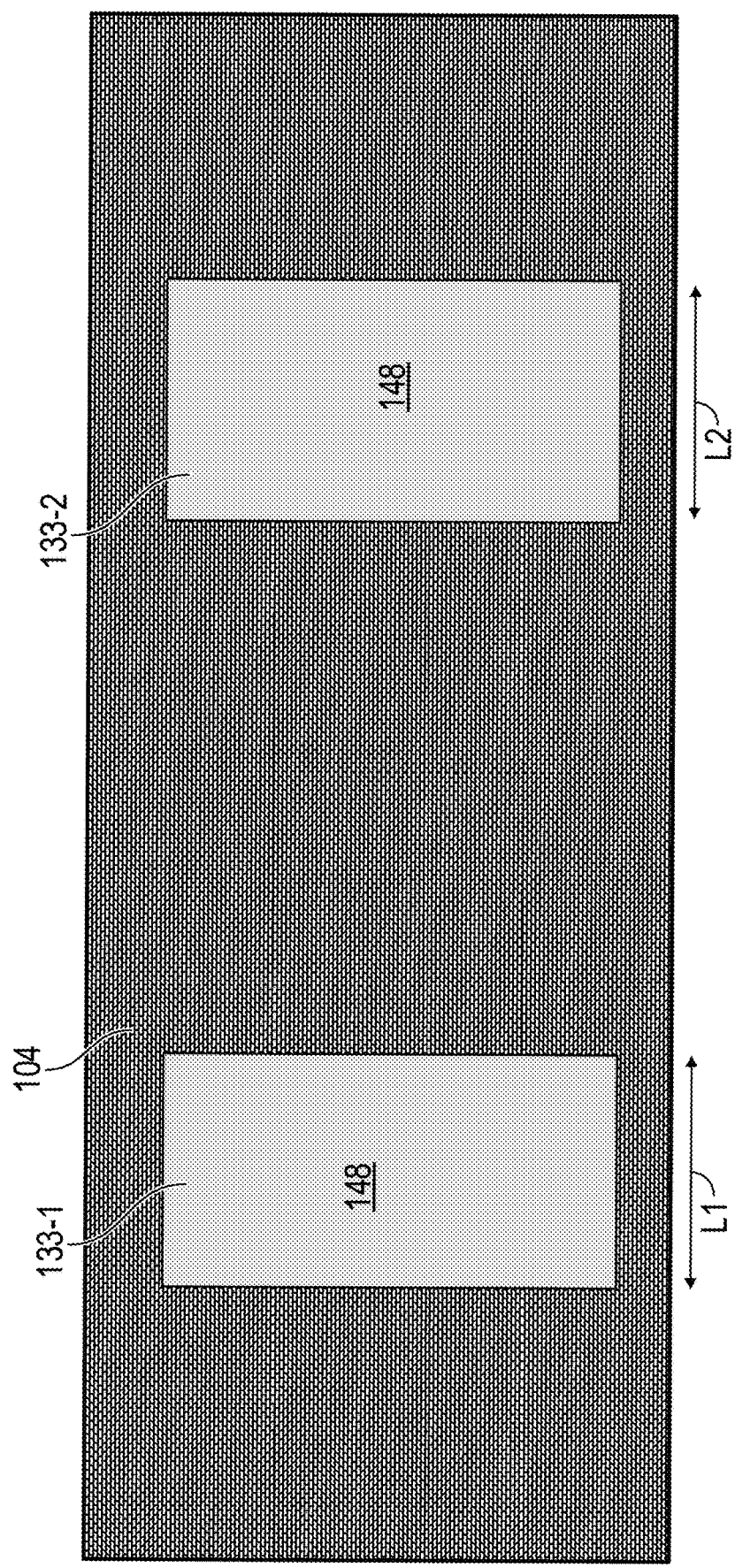
FIG. 5 illustrates a top view of FIG. 4, according to certain embodiments.

The etch mask is removed after etching the first stack of layers 101, followed by growing second stacks in the openings formed in the first stack of layers 101. The first stack of layers 101 is also referred to as a first layer stack 101. The second stacks can include alternating layers of semiconductor material. For example, the alternating layers of the second stack can include (from the bottom up) SiGe2, SiGex, epi channel 1, SiGex, epi channel 2, SiGex, epi channel 3, and SiGex. Note that one or more stacks can be formed depending on 3D circuit layout requirements. The example process flow of FIGS. 1-21 illustrates an embodiment including two NMOS devices in upper and lower positions of the stack (Metal 2 suitable for NMOS device) with one PMOS device in center (Metal 1 suitable/selected for PMOS device). FIG. 4 illustrates this example. FIG. 4 shows removal of the mask layer 126 of FIG. 3, followed by depositing second stacks 133-1 and 133-2 in the openings 132-1 and 132-2 respectively. Each second stack 133-1 and 133-2 includes alternating layers made of (from the bottom up) a SiGe2 layer 134, a SiGex layer 136, an epi channel 1 layer 138, a SiGex layer 140, an epi channel 2 layer 142, a SiGex layer 144, an epi channel 3 layer 146, and a SiGex layer 148. The epi channel 1 material, epi channel 2 material, and epi channel 3 material may be a different material or the same material. The epi channel 1 material, epi channel 2 material and epi channel 3 material may include any single crystal semiconductor or compound semiconductor. Some examples include Si, SixGe1-x, Ge, SixC1-x, GexSny, The channel may also either be intrinsic or doped N+ or P+ as other options depending on circuit requirements (SiB, GeAs, SiP, SiAs as some doping examples). Further, the SiGex layers 136, 140 and 144 may be of any suitable composition that permits selectivity with respect to the epi channel layers 138, 142, and 146. FIG. 5 is a top view of FIG. 4. Future channel regions of the transistors will be beneath SiGex layer 148, and metal S/D regions will be beneath capping layer 104, as will be discussed further below.

Figure 6:
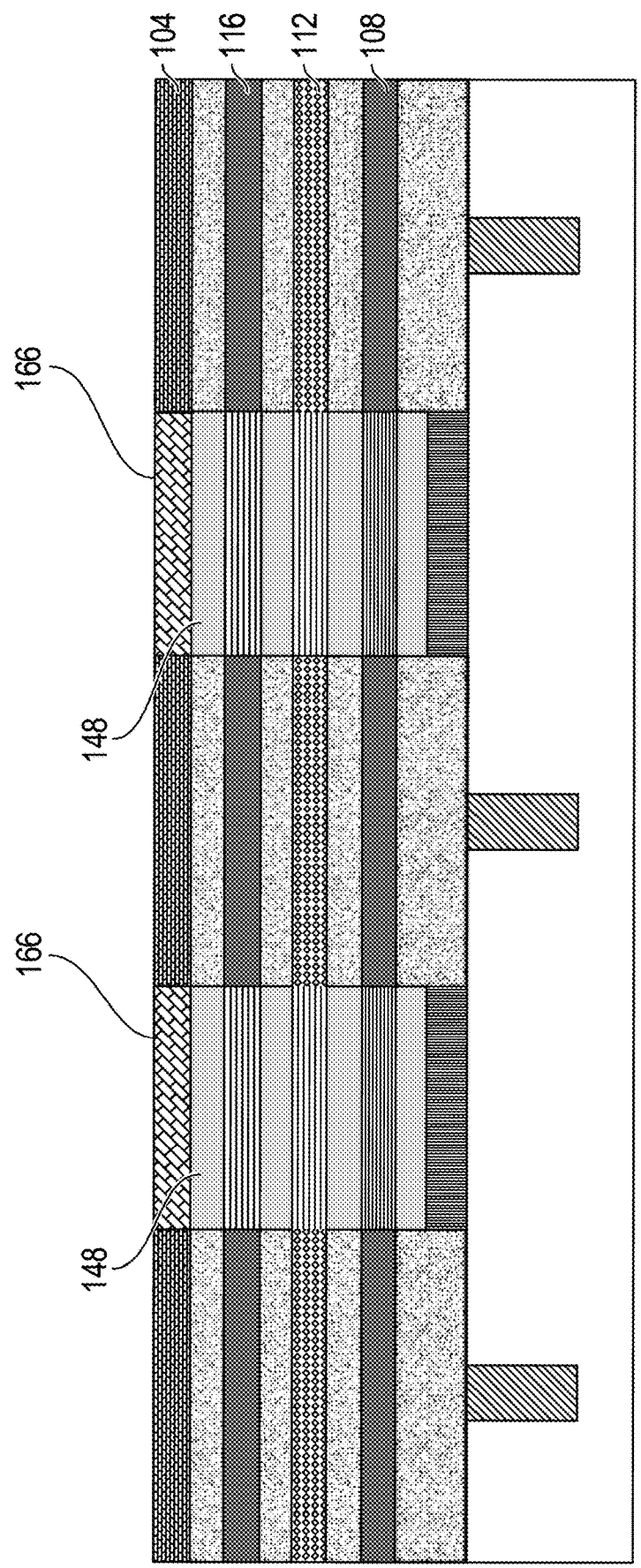
FIG. 6 illustrates depositing a second capping layer over the second stack of layers of FIG. 5, according to certain embodiments.
Figure 7:
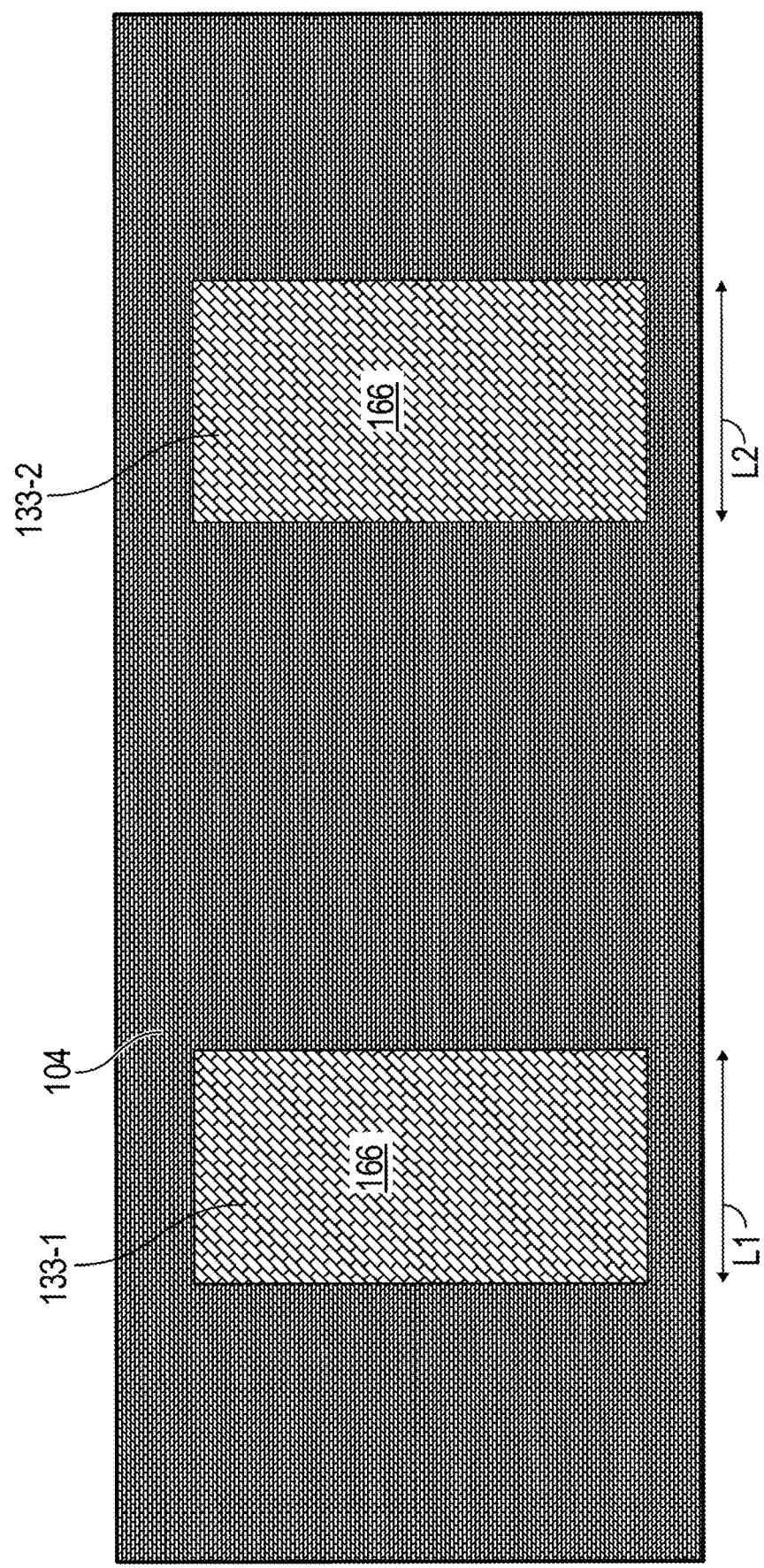
FIG. 7 illustrates a top view of FIG. 6, according to certain embodiments.

As shown in FIGS. 6 and 7, a second capping layer 166 is deposited and planarized on the substrate. This essentially adds a capping layer over the epitaxial stacks. Specifically, FIG. 6 illustrates a second capping layer 166 deposited over the layer 148 made of the SiGex material. In the example embodiment of FIGS. 1-21, the second capping layer 166 is of a different material from the first capping layer 104 such that the capping layer 166 is selective to capping layer 104.

FIG. 7 illustrates a top view of FIG. 6, in which regions of the second capping layer 166 are surrounded by the first capping layer 104. In some embodiments, layer 166 and second stacks 133-1, 133-2 having dimensions that correspond to the channel regions of the final GAA transistors within each stack. For example, in the top view of FIG. 7, the second stacks 133-1 and 133-2 may provide both the length and width dimensions of the channel of each GAA transistor within the stack. However, in the example process flow of FIGS. 1-21, the second stacks 133-1 and 133-2 are further divided into smaller stacks defining the transistor channel width.

Figure 8:
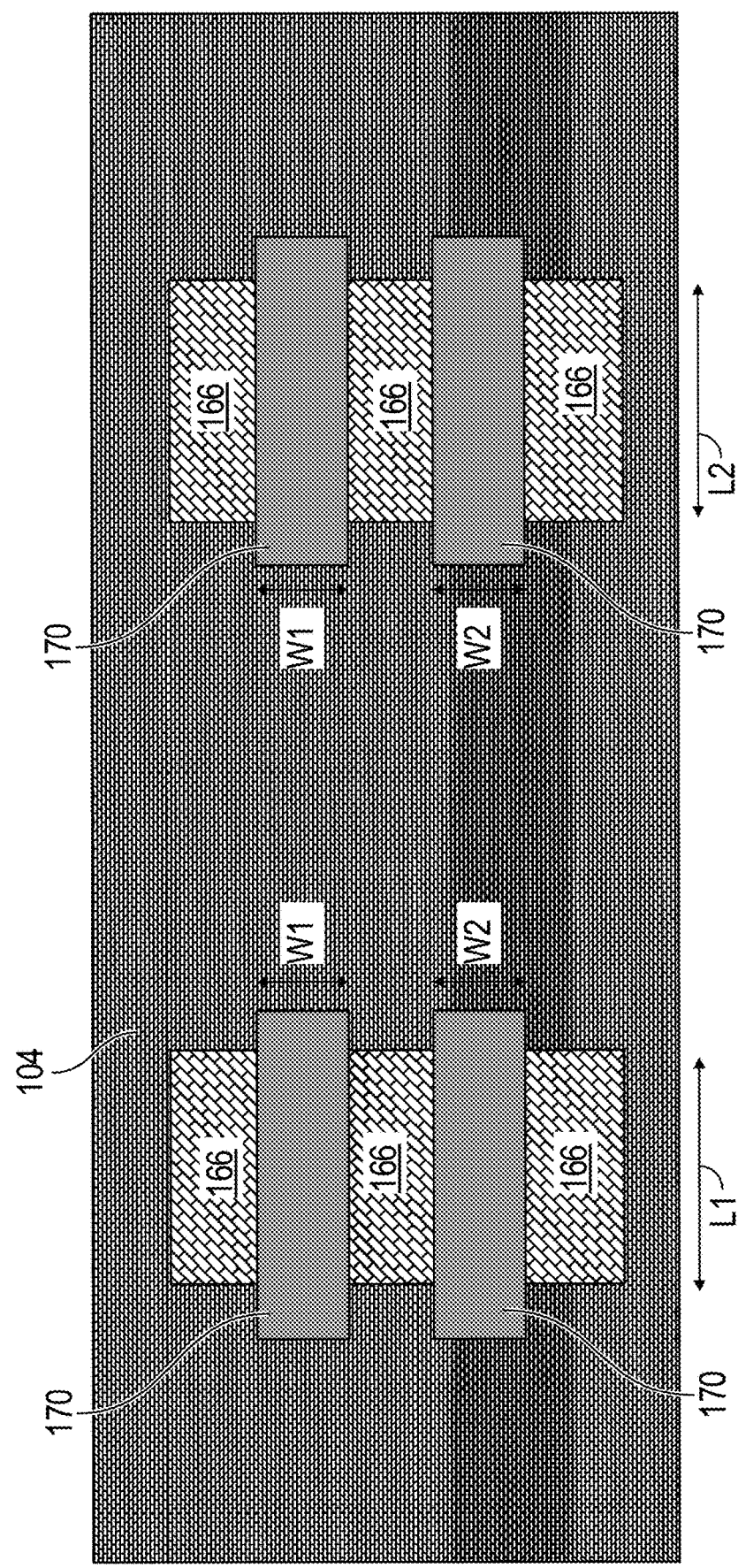
FIG. 8 illustrates a top view of FIG. 7 with a plurality of second mask layers applied over each of the second capping layers such that it extends to partially overlap the first capping layer, according to certain embodiments.

FIGS. 8-11 show the formation of four second stacks below the mask layer 170 that will each provide three stacked GAA transistors for a total of 12 GAA transistors. The substrate is masked (FIG. 8, which is a top view). Future channel regions are beneath SiGex, and metal S/D regions are beneath capping layer. FIG. 8 illustrates the top view of FIG. 7 with a mask layer 170 deposited over the first capping layer 104 and second capping layer 166. The mask layer 170 is also referred to as a second mask layer pattern, and can be a PR mask layer. As seen in FIG. 8, the second mask layer 170 is patterned to provide four regions of PR material each of which extends over the second capping layer 166 and overlaps portions of the first capping layer 104. That is, the mask layer 170 is deposited over the layer 166 such that masked regions of the mask layer 170 are greater in length than the lengths L1 and L2. Each of the four regions of the mask layer 170 will define a respective second stack of epitaxially grown semiconductor material. Further, each of the four regions of mask layer 170 defines a channel width for transistors within its stack. Example widths W1 and W2 are shown. The widths W1 and W2 may be the same or different.

Figure 9:
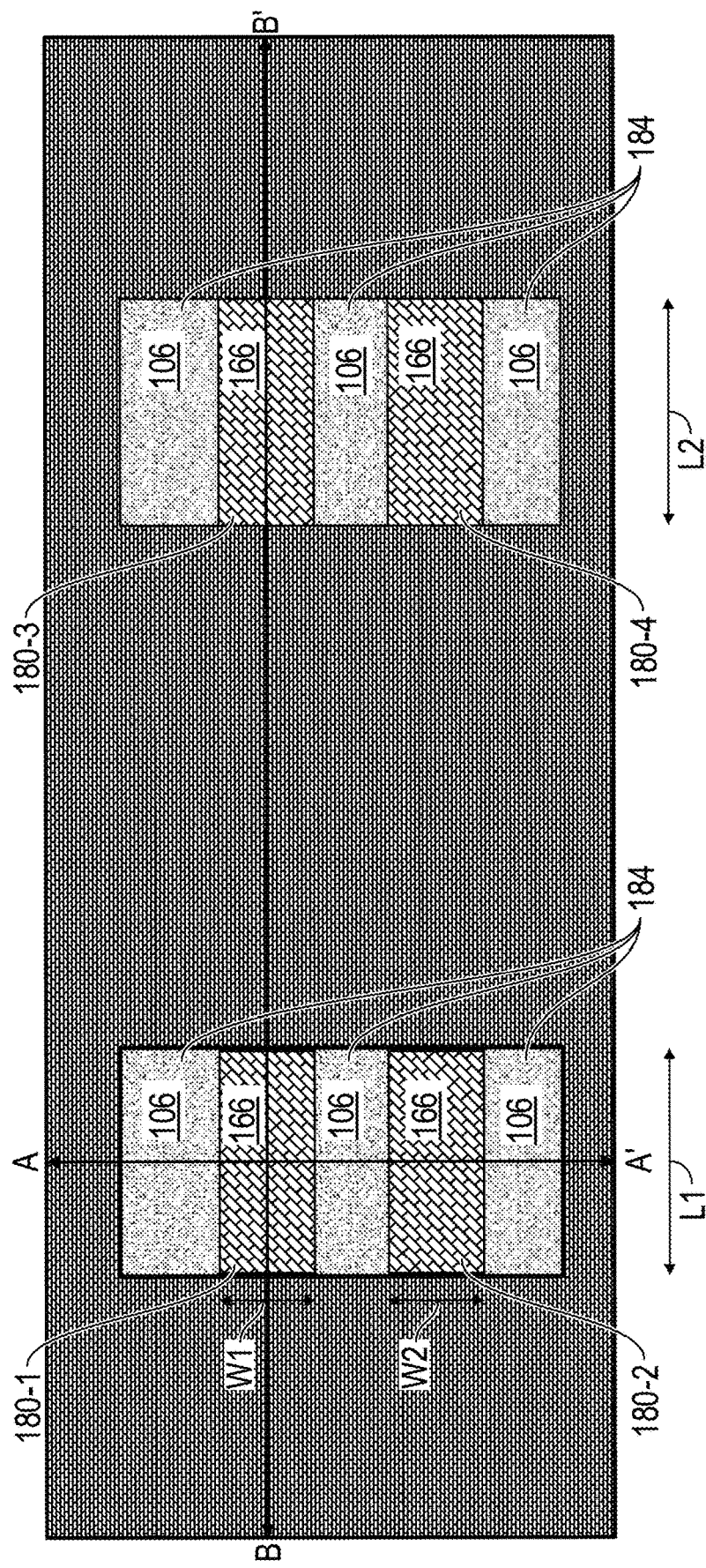
FIG. 9 illustrates a top view of FIG. 8 after etching the second stack of layers and indicating a cross section side view line (AA') and a cross section side view line (BB') of the first stack of layers, according to certain embodiments.

FIG. 9 shows top view after etching the epi stack within openings and removing the etch mask. Specifically, FIG. 9 illustrates a top view of FIG. 8 upon removal of the mask layer 170 and etching of portions of the stacked layers not covered by the mask layer 170. The etching exposes regions of the dielectric layer 106 and generates four of the second stacks 180-1, 180-2, 180-3 and 180-4. FIG. 9 also illustrates the line AA' and the line BB' utilized to illustrate a side view of a cross-section of the region along the lines below.

Figure 10:
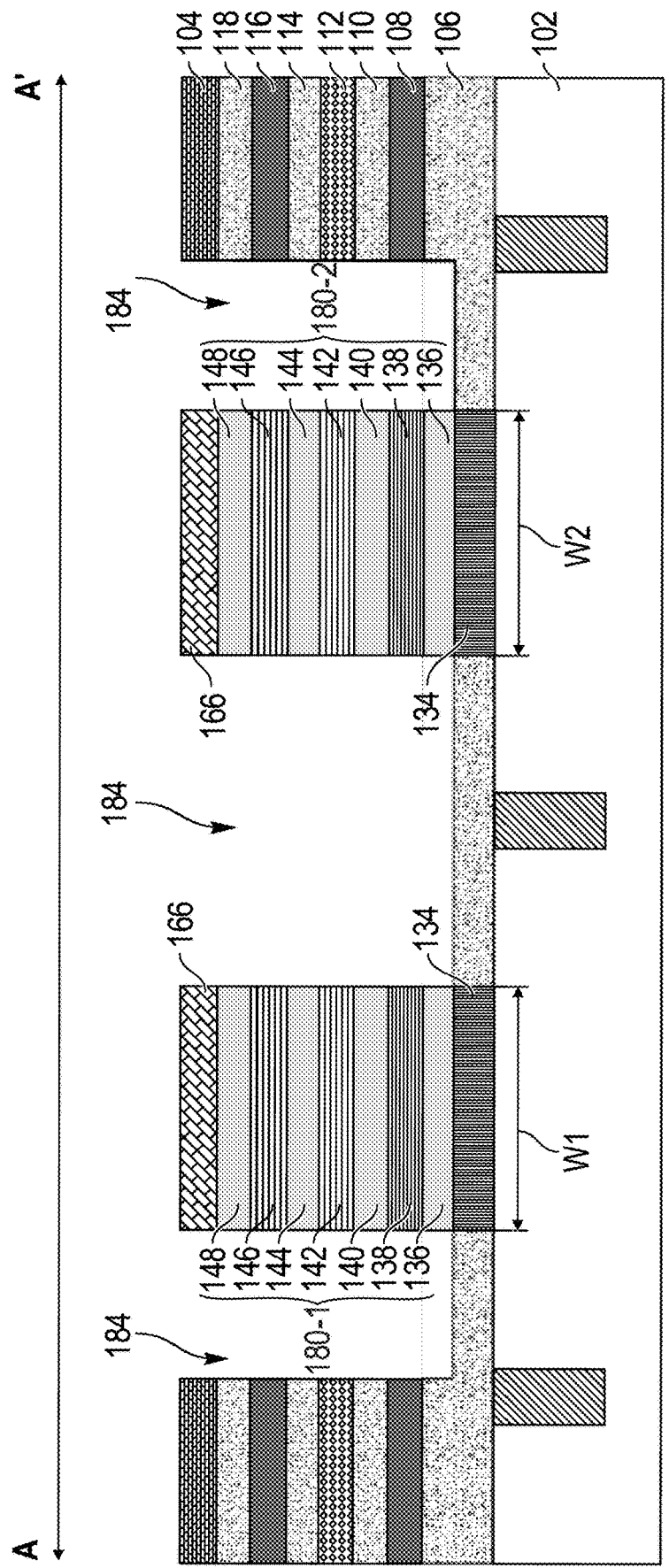
FIG. 10 illustrates a cross section side view along the line (AA') of the first stack of layers after etching the second stack of layers to form a third stack of layers, according to certain embodiments.

FIG. 10 shows a side view cross-section through cut line AA' passing through second stacks 180-1 and 180-2. The stack 180-1 has a width W1 the stack 180-2 has a width W2. Accordingly, each second stack 180-1 and 180-2 includes layers 134, 136, 138, 140, 142, 144, 146, and 148 underneath the capping layer 166. The layers are formed by etching of the alternating layers 134, 136, 138, 140, 142, 144, 146, and 148 (as illustrated previously in FIG. 4) of the first stack 100. Note that opposing sides of the metal layers 108, 112 and 116 of the first stack 100 are not connected to channel regions formed by epi channel layers 138, 142 and 146 due to the openings 184. This space within the openings 184 may be used for additional routing features.

Figure 11:
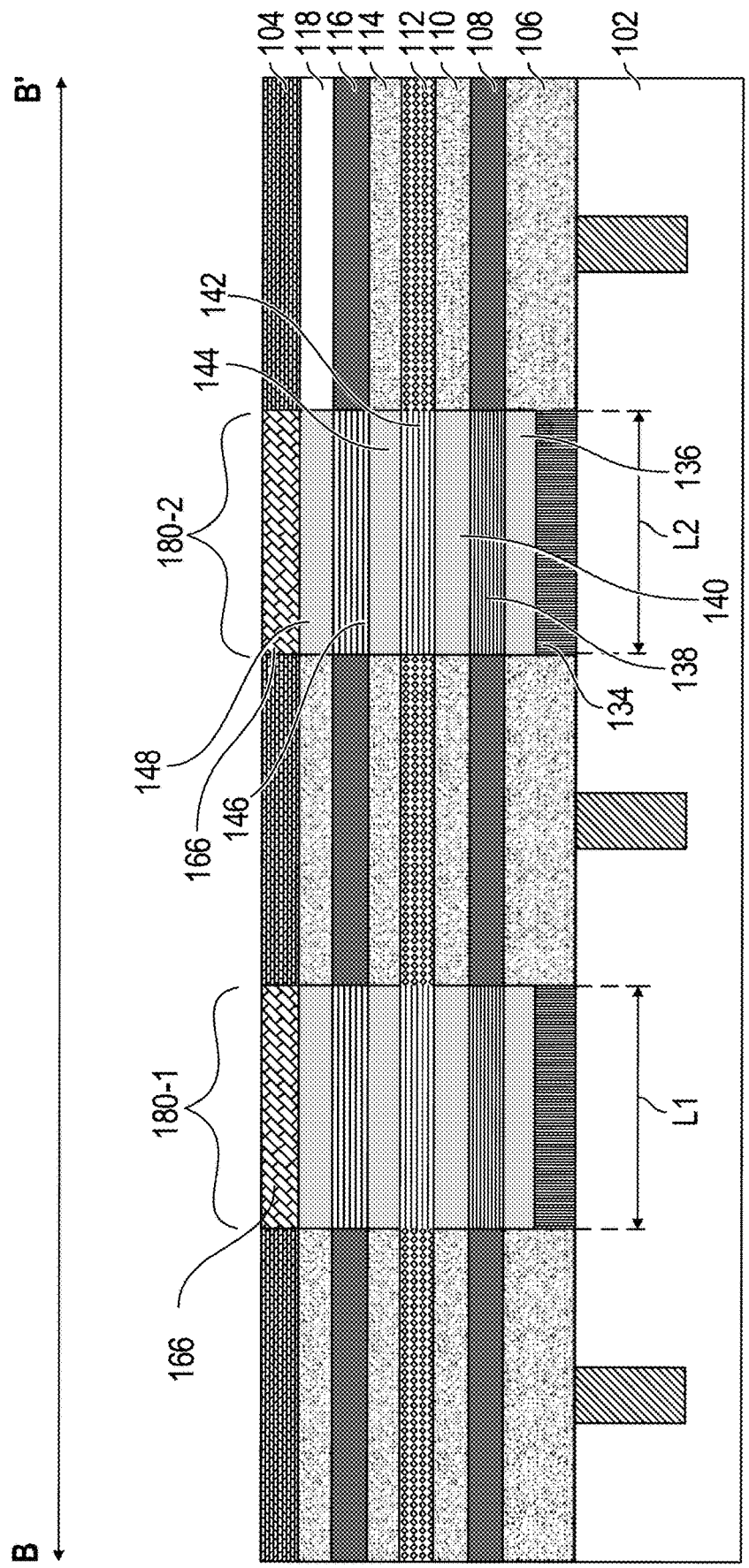
FIG. 11 illustrates a cross section side view along the line (BB') of the first stack of layers after etching the second stack of layers to form the third stack of layers in FIG. 10, according to certain embodiments.

FIG. 11 shows a side view cross-section through cut line BB' passing through stacks 180-1 and 180-3. As seen, the stack 180-3 has a width W1 and includes layers 134, 136, 138, 140, 142, 144, 146, and 148 underneath the capping layer 166. The layers are formed by etching of the alternating layers 134, 136, 138, 140, 142, 144, 146, and 148 (as illustrated previously in FIG. 4) of the first stack 100. As seen, the layers of the first stack 101 are a same thickness as the layers of each second stacks 180-1, 180-2, 180-3, and 180-4 such that the metal layers 108, 112 and 116 are vertically aligned to contact opposing ends of the epi channel layers 138, 142 and 146. Thus, the metal for S/D regions are connected to the channel regions and are self-aligned for the L direction cross section along BB'.

Figure 12:
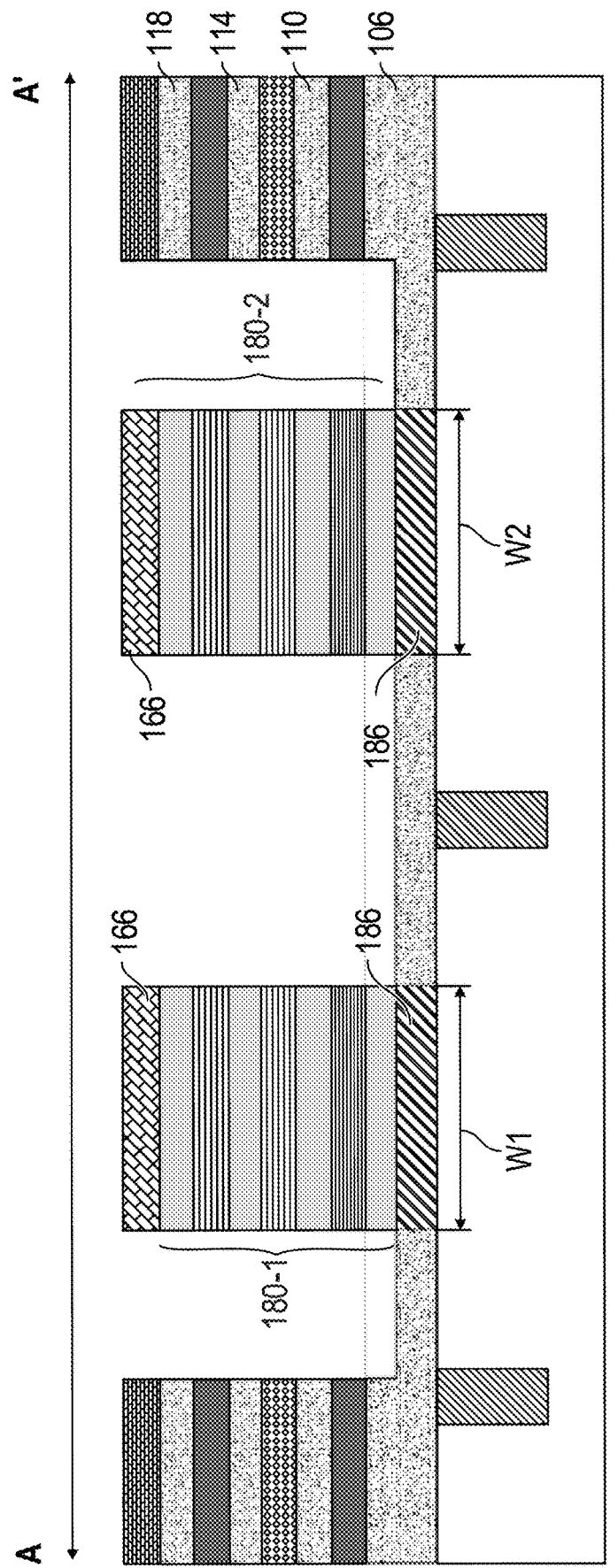
FIG. 12 illustrates a cross section side view of FIG. 10 along the line (AA') by removing a semiconductor (SiGe2) layer underlying the third stack of layers and depositing a dielectric layer to replace the removed semiconductor layer, according to certain embodiments.
Figure 13:
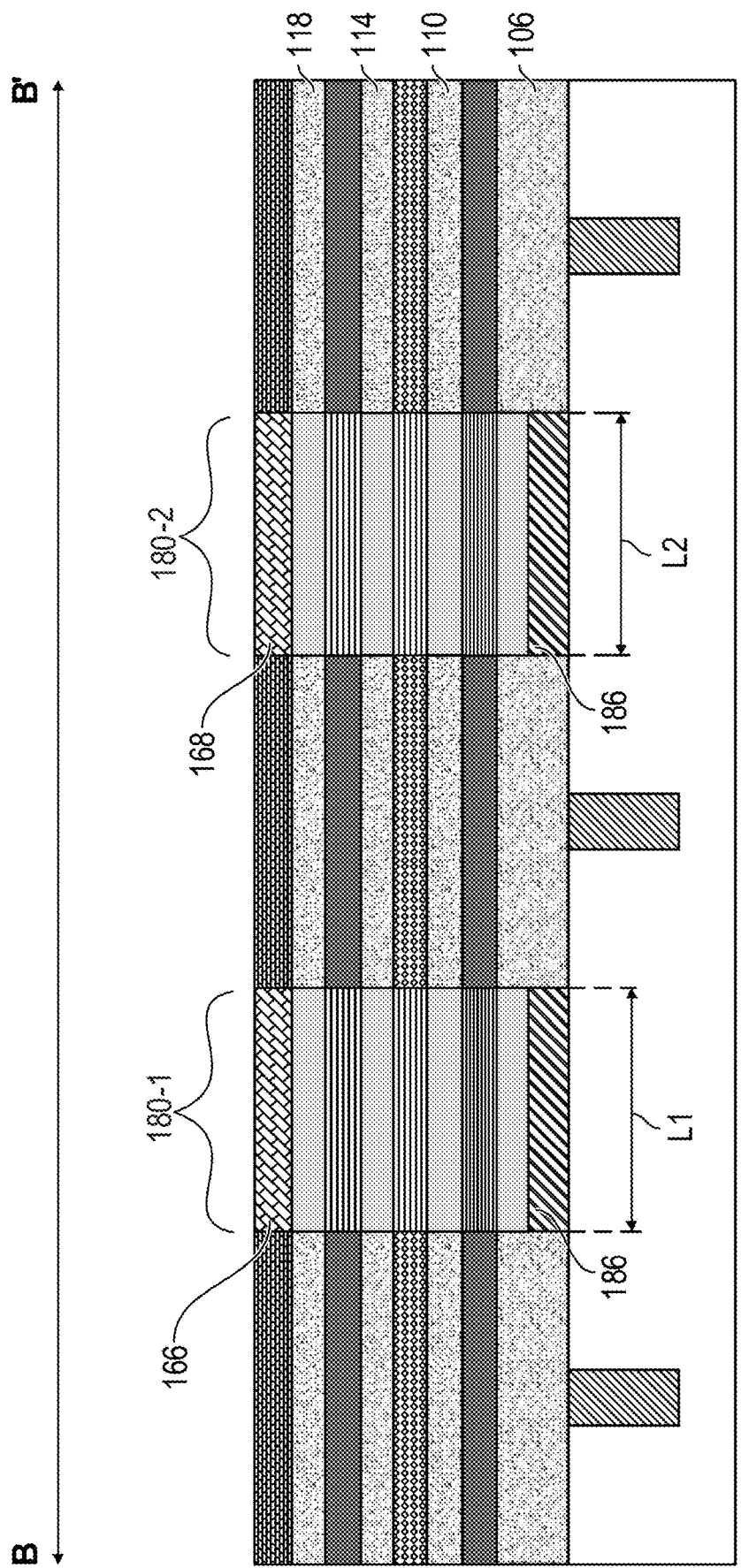
FIG. 13 illustrates a cross section side view of FIG. 11 along the line (BB') by removing a semiconductor (SiGe2) layer underlying the third stack of layers and depositing a dielectric layer to replace the removed semiconductor layer, according to certain embodiments.

FIG. 12 illustrates through cut line AA' after replacing SiGe2 layer 134 (bottom layer of epi stack) with Dielectric 2 186, while FIG. 13 illustrates the structure of FIG. 12 through cut line BB'. Although FIG. 10 shows the dielectric material 106 as having the same thickness as the SiGe2 layer 134 at the bottom of the stacks, those skilled in the art will understand that the thickness of the dielectric material 106 must be less than that of the SiGe2 layer 134 so that the layer 134 is exposed for selective etching and selective deposition of Dielectric 2 186.

Figure 14:
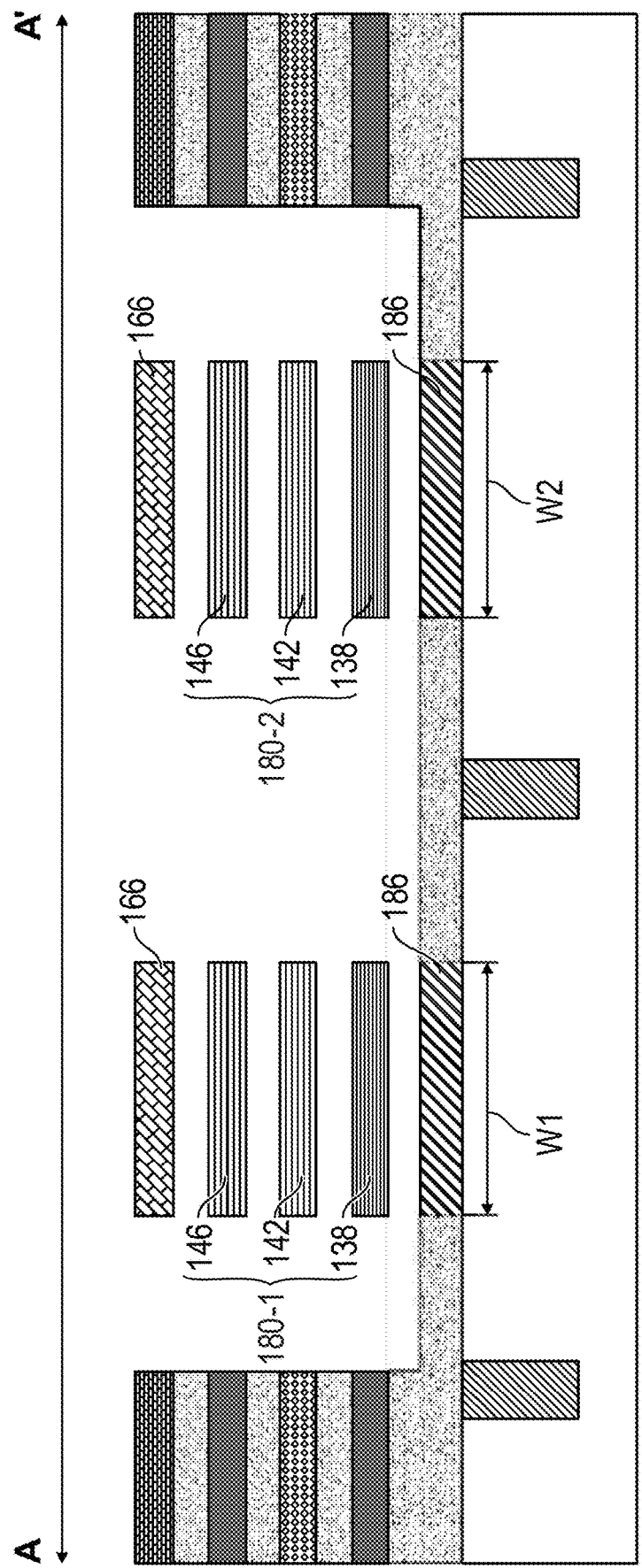
FIG. 14 illustrates a cross section side view of FIG. 12 along the line (AA') of the first stack of layers by removal of the semiconductor (SiGex) layers from the third stack of layers, according to certain embodiments.
Figure 15:
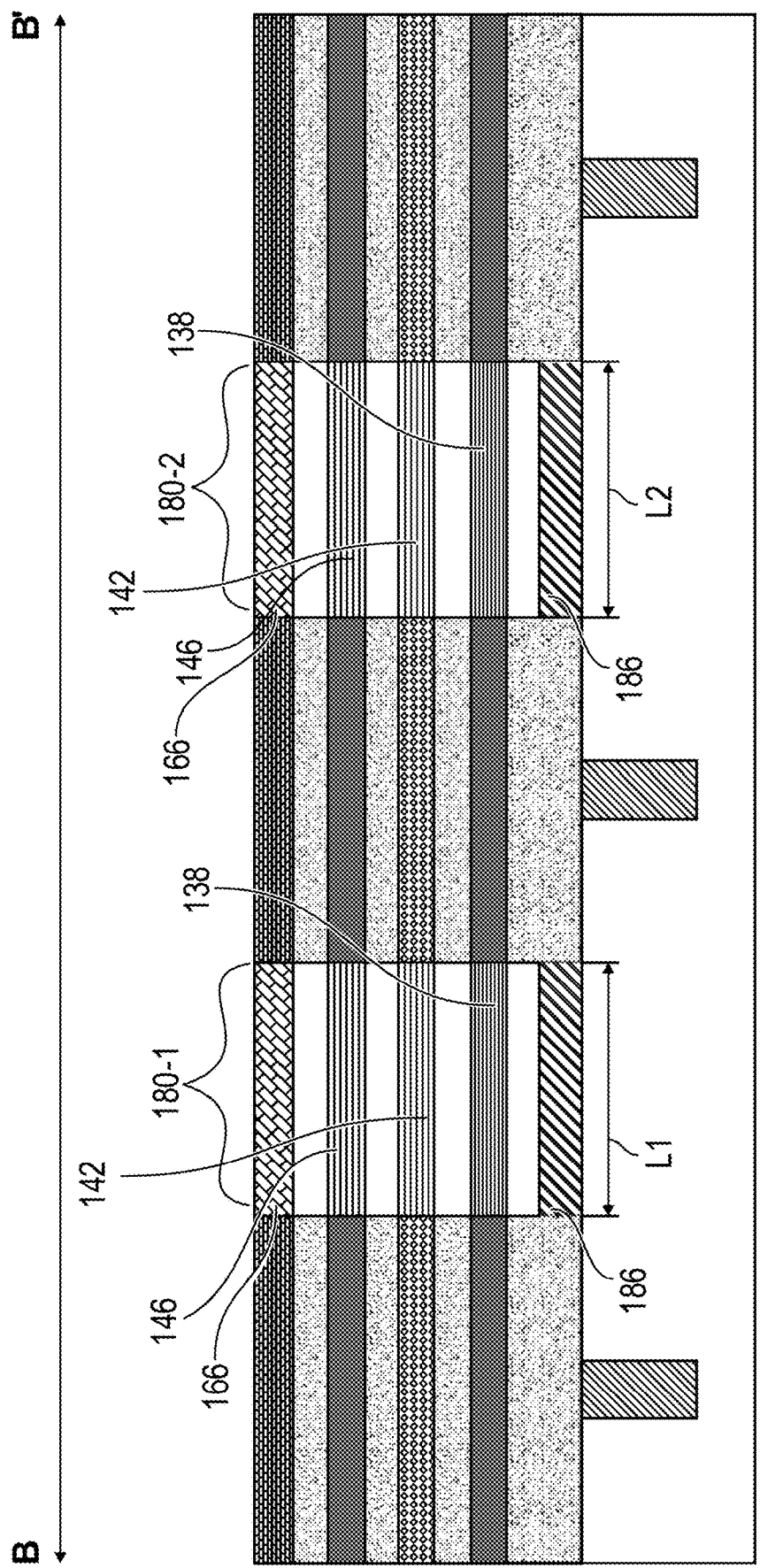
FIG. 15 illustrates a cross section side view of FIG. 13 along the line (BB') of the first stack of layers upon removal of the semiconductor (SiGex) layers from the third stack of layers, according to certain embodiments.

FIGS. 14 and 15 illustrate releasing the channel regions of each epi stack. FIG. 14 shows a side cross-section after removal of SiGex layers from the epi stacks 180-1 and 180-2 by selective etching. The second stacks 180-1 and 180-2 are supported by the first stack 100 as shown in the BB' cross-section in FIG. 15.

Figure 16:
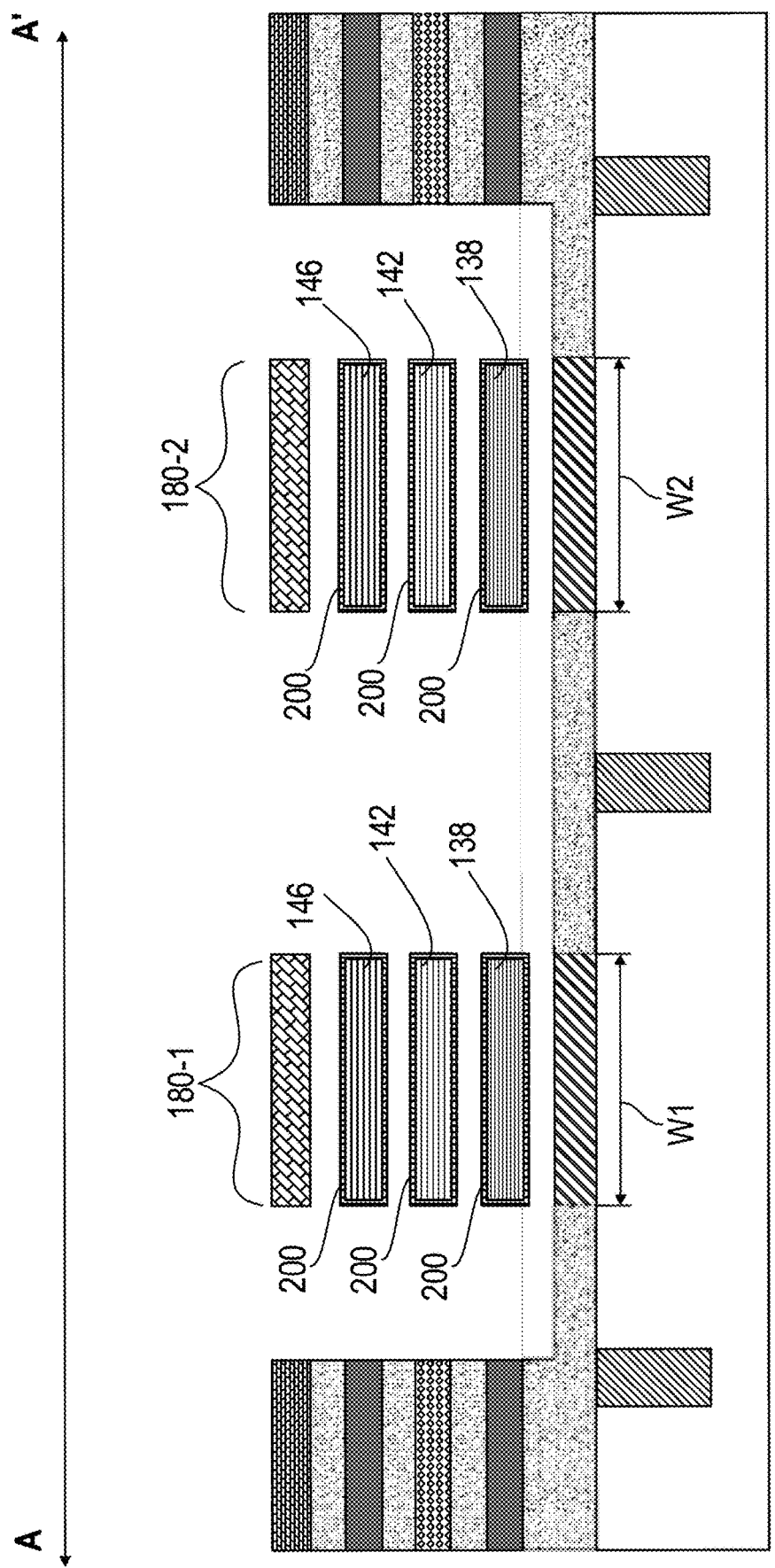
FIG. 16 illustrates a cross section side view of FIG. 14 along the line (AA') of the first stack of layers by depositing high-k dielectric layers in the third stack of layers, according to certain embodiments.

After releasing of the epi channel layers 138, 142 and 146 of each stack, the gate-all-around (GAA) structure is formed around each of these layers as shown in FIGS. 16-19. First, a selective high-k deposition is executed that deposits high-k material on uncovered epi channels. FIG. 16 illustrates a side view cross-section through the cut line AA' of FIG. 14 after deposition of a high-k gate material on the exposed surfaces of the epi channel layers.

Specifically, high-k gate layers 200 are selectively deposited on the exposed surfaces of the layers 138, 142 and 146 of each stack. As seen, a high-k layer 200 surrounds each of the epi channel layers.

Figure 17:
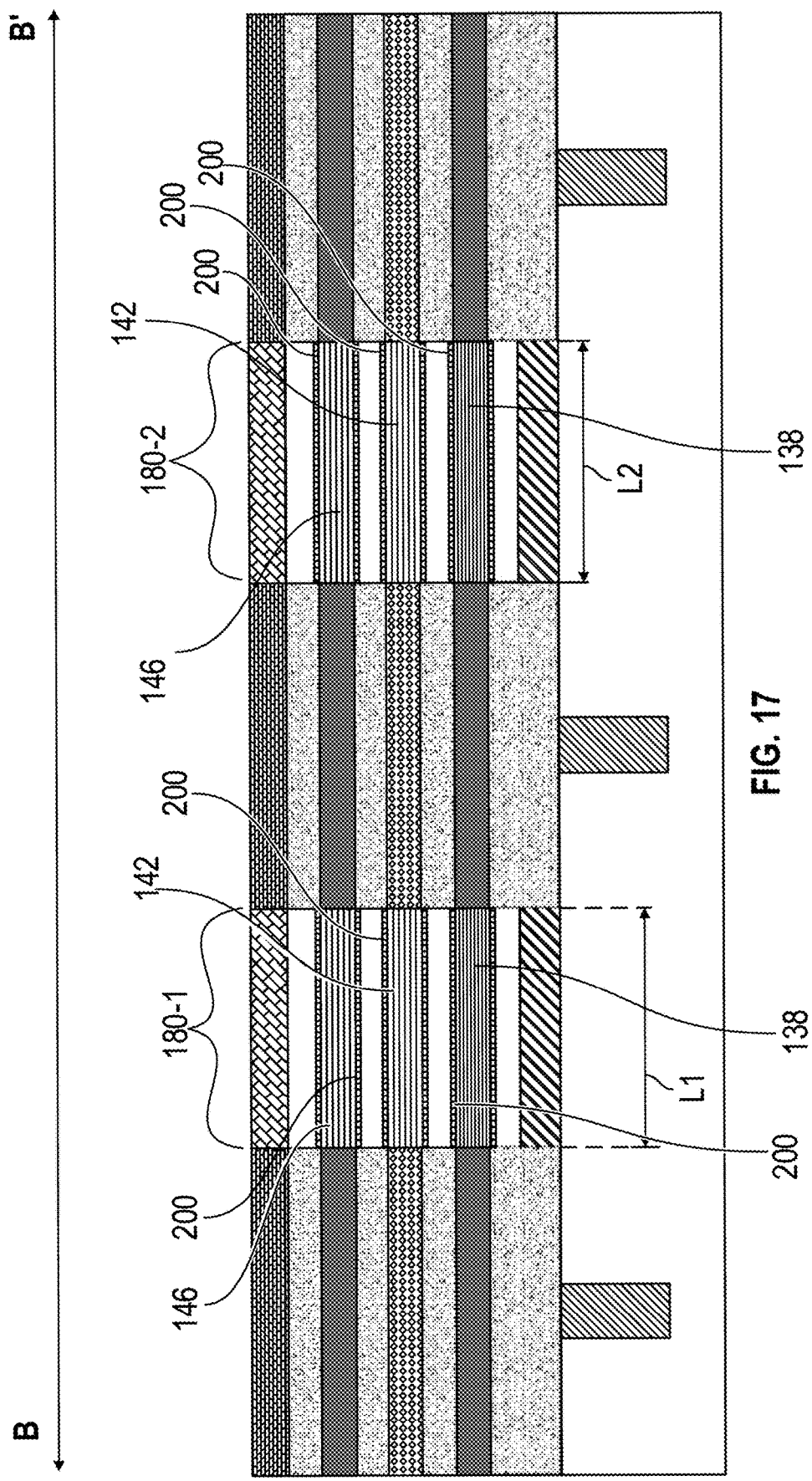
FIG. 17 illustrates a cross section side view of FIG. 15 along the line (BB') of the first stack of layers by depositing the high-k dielectric layers in the third stack of layers, according to certain embodiments.

FIG. 17, illustrates the side view cross-section through the cut line BB' of FIG. 15 after deposition of a high-k gate layer 200 made of a high-k gate material on the exposed surfaces of the layers 138, 142 and 146. Note that in this view the high-k layer 200 does not cover opposing sides of the epi channel layers 138, 142 and 146 because the metal and dielectric of the first stack of layers 101 prevents deposition on these surfaces.

Figure 18:
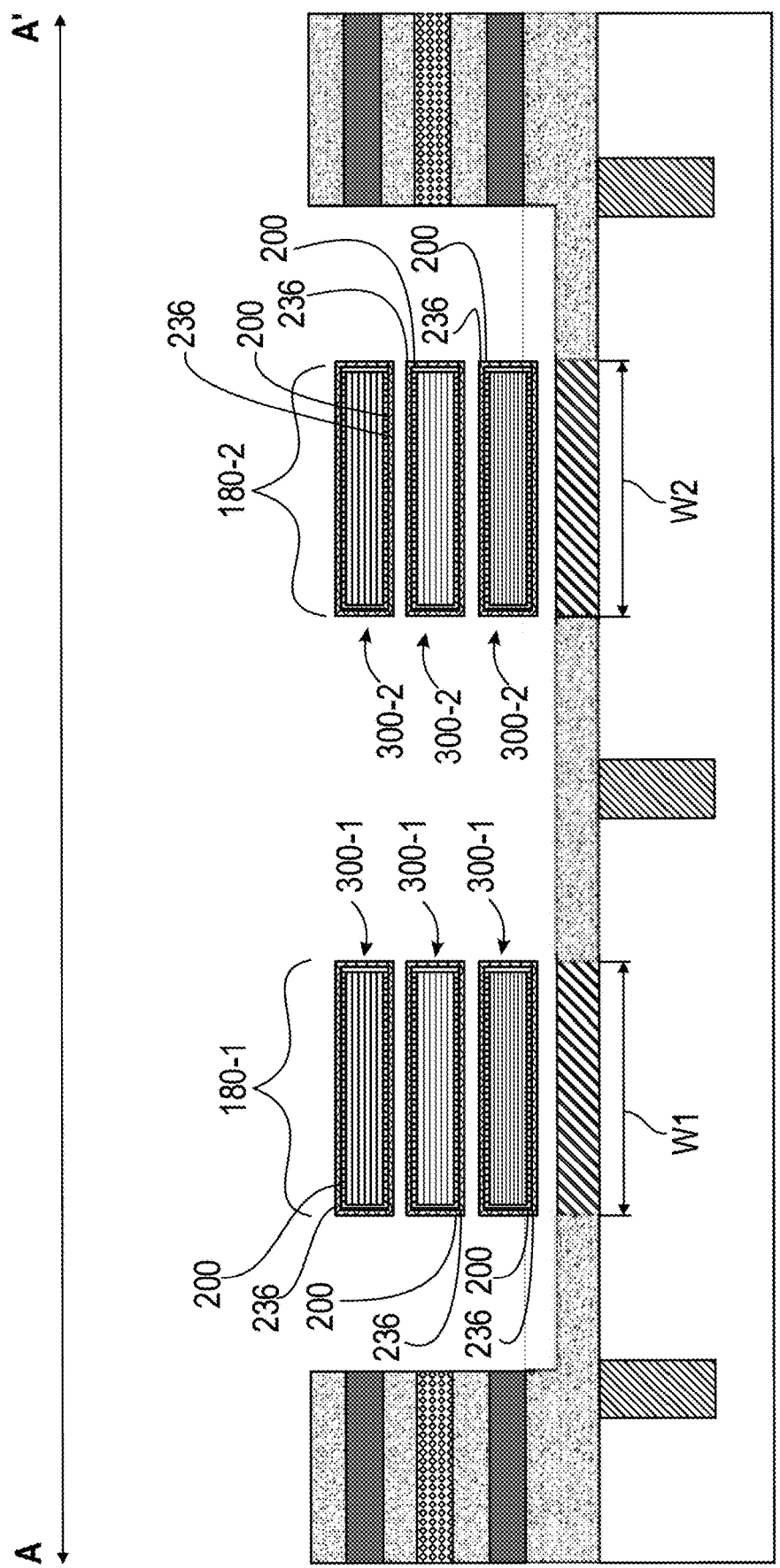
FIG. 18 illustrates a cross section side view of FIG. 16 along the line (AA') of the first stack of layers after etching of the first capping layer and the second capping layer and deposition of metal gate stack layers, according to certain embodiments.
Figure 19:
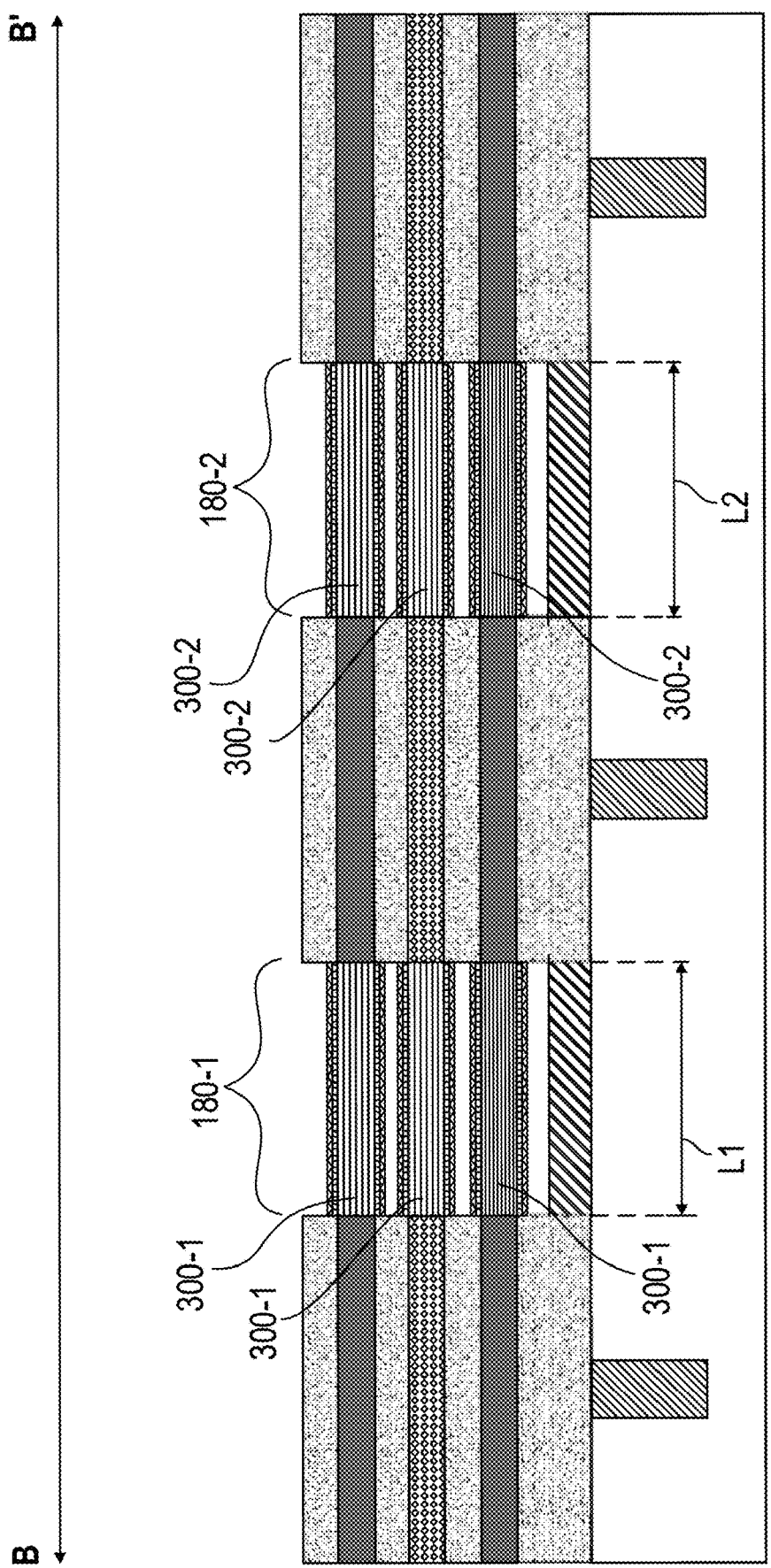
FIG. 19 illustrates a cross section side view of FIG. 17 along the line (BB') of the first stack of layers after etching of the first capping layer and the second capping layer and deposition of the metal gate stack layers in the third stack of layers, according to certain embodiments.

Next a metal stack can be formed on the high-k layers surrounding the channels. This can be executed by a conformal deposition followed by etching excess material, or by selective deposition. FIGS. 18-19 show side cross-sectional views after forming gate stacks and removed hardmasks. Specifically, FIG. 18 illustrates a side view cross-section through the cut line AA' of FIG. 16 As seen, metal gate layers 236 are deposited over the high-k gate layers 200.

FIG. 19 illustrates the side view cross-section through the cut line BB' of FIG. 17 after deposition of the metal gate layers 236 over the high-k gate layers 200. Forming of the gate metal layers 236 completes the formation of transistor channels 300-1 of stack 180-1 and transistor channels 300-2 of stack 180-2. In the example shown, the transistors are junctionless transistors in which the interface of the metal layers with the channel layer for source/drain regions of the transistor. Transistor channels are also completed for stacks 180-3 and 180-4.

Figure 20:
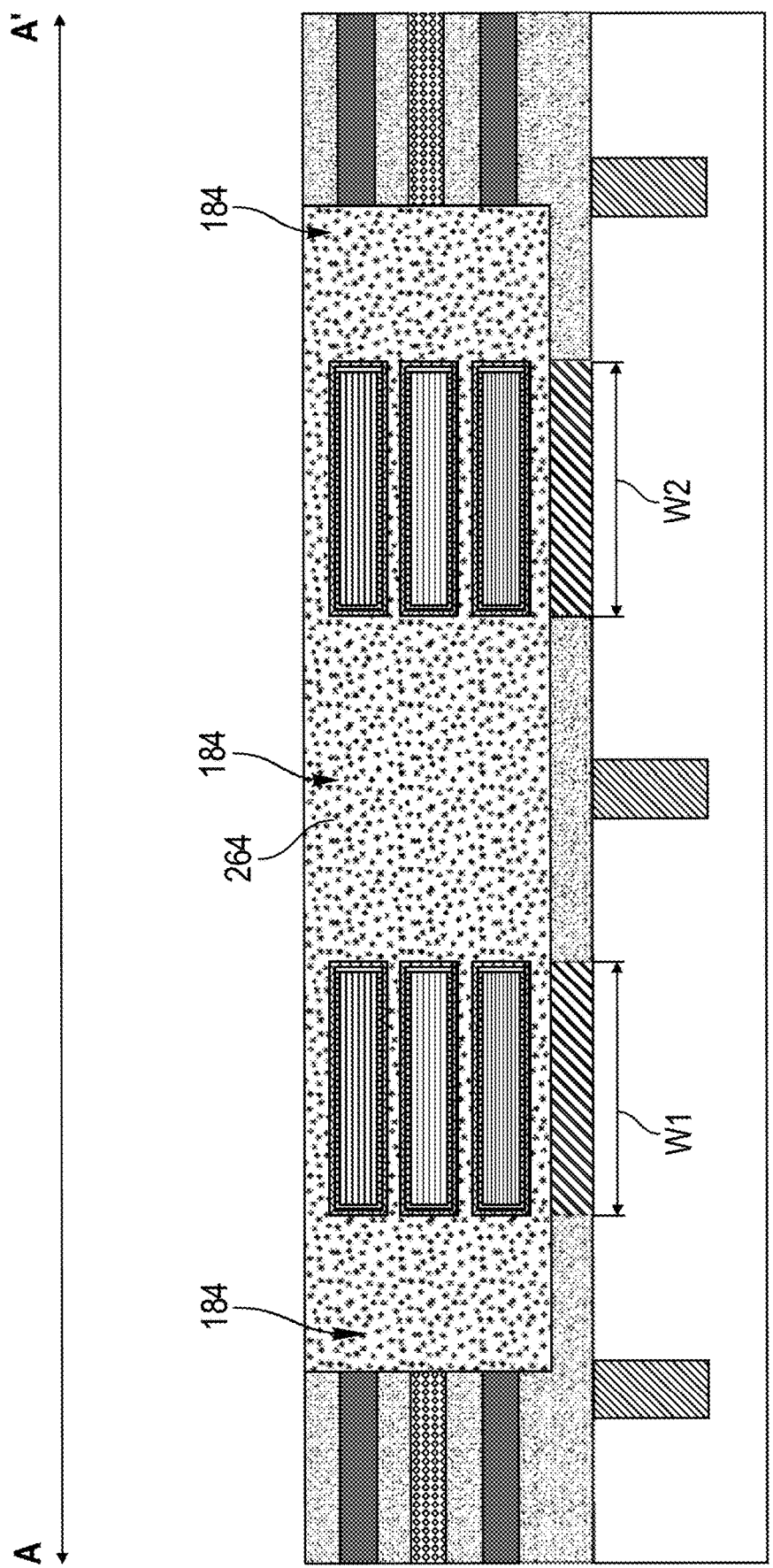
FIG. 20 illustrates a cross section side view of FIG. 18 along the line (AA') of the first stack of layers after deposition of a dielectric material followed by chemical mechanical polishing, according to certain embodiments.
Figure 21:
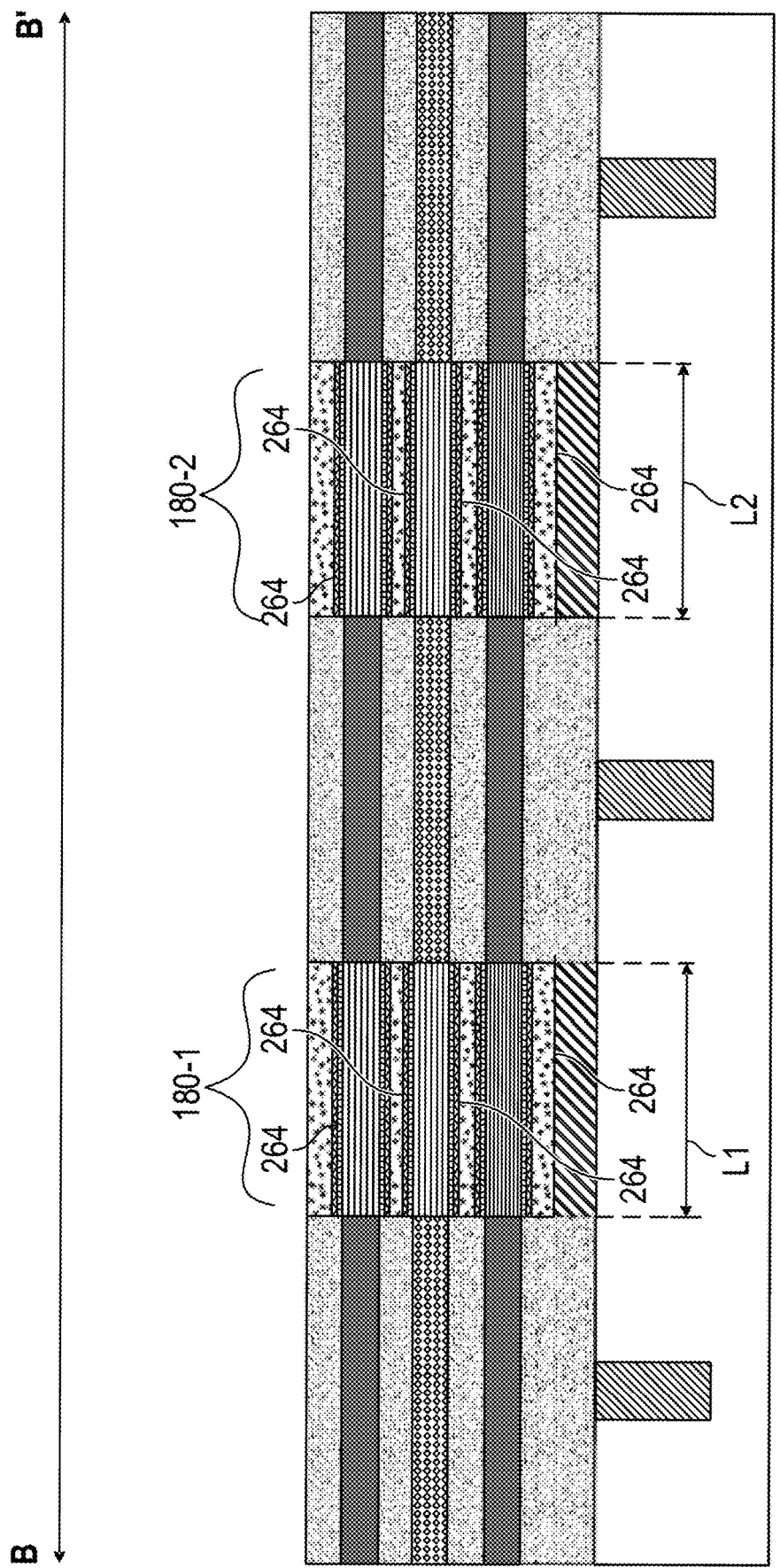
FIG. 21 illustrates a cross section side view of FIG. 19 along the line (BB') of the first stack of layers after deposition of the dielectric material followed by chemical mechanical polishing, according to certain embodiments.

In FIGS. 20-21, a dielectric is deposited to fill openings surrounding the horizontal channels. This shows a vertical stack of three transistors. As can be appreciated, many more transistors can be stacked.

FIG. 20 illustrates a side view cross-section through the cut line AA' of FIG. 18 with a filling material 264 deposited to fill the open spaces 184. FIG. 21, illustrates the side view cross-section through cut line BB' of FIG. 19 after deposition of the filling material 264 deposited to fill the open spaces in the third stack 183 and the fifth stack 183. The filling material 264 may be a dielectric material.

FIG. 22 illustrates a data flow diagram 2200 of a non-limiting example of processing a substrate. In step 2202, a first layer stack 101 is formed on a substrate 102, the first layer stack 101 including metal layers (108, 112, and 116 of FIG. 1) and dielectric layers (106, 110, 114, and 118 of FIG. 1) that alternate in the first layer stack 101.

In step 2204, openings (132-1 and 132-2 of FIG. 3) are formed in the first layer stack 101, such that a semiconductor layer 102 positioned under the first layer stack 101 is uncovered.

In step 2206, a second stack of layers (133-1 of FIG. 4) is formed within the openings (132-1) from the semiconductor layer 102 by epitaxial growth, the second stack of layers (133-1) including alternating layers of semiconductor material (134, 136, 138, 140, 142, 144, 146, and 148 of FIG. 4) aligned with respective layers of the first layer stack 101.

In step 2208, transistor channels (300-1 and 300-2 of FIG. 18) are formed from the semiconductor layers of the second stack of layers (133) in a same plane as metal layers (108, 112, and 116) from the first stack 101, such that the transistor channels formed by the epi channel layers (138, 142, and 146) extend between given metal layers (108, 112, and 116) within the openings (132-1 and 132-2).

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures.

The description may reference particular types of substrates, but this is for illustrative purposes only. Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of processing a substrate, the method comprising:
    forming a first layer stack on a substrate, the first layer stack including conductive layers and dielectric layers that alternate in the first layer stack and a capping layer formed over the first layer stack;
    forming an opening in the first layer stack, the opening extending through each of the conductive layers in the first layer stack such that sidewalls of each of the conductive layers are exposed within the opening, and such that a semiconductor surface of the substrate is exposed;
    forming a second stack of layers within the opening, the second stack of layers including channel layers of semiconductor material positioned in the second stack of layers such that each channel layer contacts exposed sidewalls of a respective conductive layer of the first layer stack, the second stack of layers formed by epitaxially growing sacrificial layers of semiconductor material that alternate with the channel layers of semiconductor material in the second stack, and forming a second capping layer over the second stack of layers;
    depositing a second mask layer over the second capping layer of the second stack of layers, such that a second mask layer extends over the second capping layer to overlap a portion of the capping layer, wherein a width of the second mask layer is equal to a second predetermined distance; and
    forming transistor channels from the channel layers of the second stack such that each transistor channel extends between exposed sidewalls of a respective conductive layer within the opening.

2. The method of claim 1, wherein the forming a first layer stack comprises depositing metal layers as the conductive layers.

3. The method of claim 2, wherein the depositing metal comprises depositing a different metal material for each of the metal layers.

4. The method of claim 2, wherein the depositing metal comprises depositing a same metal material for each of the metal layers.

5. The method of claim 1, wherein the forming a second stack comprises epitaxially growing sacrificial layers of SiGe material which provide etch selectivity with respect to the channel layers.

6. The method of claim 1, wherein the forming a second stack of layers comprises forming each of the channel layers in a same plane as a respective conductive layer such that ends of the channel layers are aligned with sidewalls of the respective conductive layer.

7. The method of claim 1, wherein the forming a second stack of layers comprises forming a plurality of second stacks of layers within the opening by etching an opening in the second stack that divides the second stack into a plurality of second stacks.

8. The method of claim 1, wherein:
    the forming an opening comprises forming a plurality of openings in the first layer stack,
    the forming a second stack of layers comprises forming a plurality of second stacks within the openings respectively, and
    forming transistor channels from the channel layers of each second stack of layers.

9. The method of claim 1, wherein the forming transistor channels comprises forming a gate-all-around (GAA) structure around each channel layer.

10. The method of claim 9, wherein the gate-all-around GAA structure comprises:
    selectively depositing a high-k dielectric layer around the channel layer; and
    selectively depositing a gate metal on the high-k dielectric layer.

11. The method of claim 1, further comprising:
    forming the opening in the first layer stack by:
        depositing a first mask layer over at least a portion of the capping layer that is deposited on top of the first layer stack; and
        executing a first etching, the first etching etches portions of the first layer stack not covered by the first mask layer to form the opening in the first layer stack, wherein the opening in the first layer stack is a length of a predetermined distance.

12. The method of claim 11, further comprising:
    executing a second etching on the second stack of layers, the second etching etches a first set of portions of the second stack of layers not covered by the second mask layer to form openings in the second stack of layers.

13. A method of processing a substrate, the method comprising:
    forming a first stack of layers on a substrate, the first stack of layers including metal layers and dielectric layers that alternate in the first stack of layers, and a capping layer formed over the first stack of layers;

forming openings in the first stack of layers and depositing a first semiconductor layer in the openings uncovered in the first stack of layers such that the first semiconductor layer rests over the substrate, wherein the openings in the first stack of layers include a first opening and a second opening, and wherein the first opening and the second opening has a base that is formed by a substrate layer;

forming a second stack of layers within the openings over the first semiconductor layer by epitaxial growth, the second stack of layers including second semiconductor layers and epitaxial layers that alternate in the second stack of layers and are aligned with respective layers of the first stack of layers;

forming transistor channels from the epitaxial layers of the second stack of layers in a same plane as the metal layers from the first stack of layers such that the transistor channels extend between the metal layers and the epitaxial layers within the openings;

forming a second stack of layers within each of the first opening and the second opening; and depositing another capping layer over each of the second stack of layers formed within the first opening and the second opening; and depositing a second mask layer over the another capping layer of the second stack of layers, such that the second mask layer extends over the another capping layer to overlap a portion of the capping layer, wherein a width of the second mask layer is equal to a second predetermined distance.

14. The method of claim 13, further comprising:
forming the openings in the first stack of layers by:
depositing a first mask layer over at least a portion of the capping layer that is deposited on top of the first stack of layers; and
executing a first etching, the first etching etches portions of the first stack of layers not covered by the first mask layer to form the openings in the first stack of layers, wherein the openings in the first stack of layers are of a length equal to a predetermined distance.

15. The method of claim 14, wherein the first mask layer includes a photoresist (PR) mask layer.

16. The method of claim 14, further comprising:
executing a second etching on the second stack of layers, the second etching etches a first set of portions of the second stack of layers not covered by the second mask layer to form openings in the second stack of layers.

17. The method of claim 16, wherein a second set of portions of the second stack of layers covered beneath the second mask layer form a third stack of layers based on the second etching, wherein the third stack of layers are of a width equal to the second predetermined distance.

18. The method of claim 17, wherein the second set of portions of the second stack of layers covered beneath the second mask layer that form the third stack of layers include a portion of the second semiconductor layers and a portion of the epitaxial layers.

* * * * *